(12) United States Patent
Raring et al.

(10) Patent No.: US 10,283,938 B1
(45) Date of Patent: *May 7, 2019

(54) METHOD OF STRAIN ENGINEERING AND RELATED OPTICAL DEVICE USING A GALLIUM AND NITROGEN CONTAINING ACTIVE REGION

(71) Applicant: Soraa Laser Diode, Inc., Goleta, CA (US)

(72) Inventors: James W. Raring, Goleta, CA (US); Christiane Poblenz Elsass, Goleta, CA (US)

(73) Assignee: Soraa Laser Diode, Inc., Goleta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/424,516

(22) Filed: Feb. 3, 2017

Related U.S. Application Data

(60) Continuation of application No. 15/177,956, filed on Jun. 9, 2016, now Pat. No. 9,570,888, which is a division of application No. 14/444,687, filed on Jul. 28, 2014, now Pat. No. 9,379,522, which is a continuation of application No. 13/288,268, filed on Nov. 3, 2011, now Pat. No. 8,816,319.

(60) Provisional application No. 61/410,794, filed on Nov. 5, 2010.

(51) Int. Cl.
*H01S 5/343* (2006.01)
*H01S 5/34* (2006.01)

(52) U.S. Cl.
CPC ........ *H01S 5/3403* (2013.01); *H01S 5/34333* (2013.01); *H01S 5/34346* (2013.01)

(58) Field of Classification Search
CPC . H01S 5/3403; H01S 5/34346; H01S 5/34333
See application file for complete search history.

(56) References Cited

U.S. PATENT DOCUMENTS

| | | | |
|---|---|---|---|
| 4,318,058 A | 3/1982 | Mito et al. | |
| 4,341,592 A | 7/1982 | Shortes et al. | |
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,366,953 A | 11/1994 | Char et al. | |

(Continued)

FOREIGN PATENT DOCUMENTS

| CN | 1171692 | 1/1998 |
|---|---|---|
| CN | 1538534 | 10/2004 |

(Continued)

OTHER PUBLICATIONS hap:techon.nikkeibp.co jpenglishNEWS_EN20080122146009.

(Continued)

*Primary Examiner* — Laura M Menz
(74) *Attorney, Agent, or Firm* — Kilpatrick Townsend & Stockton LLP

(57) ABSTRACT

An optical device has a gallium and nitrogen containing substrate including a surface region and a strain control region, the strain control region being configured to maintain a quantum well region within a predetermined strain state. The device also has a plurality of quantum well regions overlying the strain control region.

7 Claims, 32 Drawing Sheets

(56) References Cited

U.S. PATENT DOCUMENTS

| | | |
|---|---|---|
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,828,684 A * | 10/1998 | Van de Walle ........ B82Y 20/00 372/45.011 |
| 5,888,907 A | 3/1999 | Tomoyasu et al. |
| 5,926,493 A | 7/1999 | O'Brien et al. |
| 5,951,923 A | 9/1999 | Horie et al. |
| 6,069,394 A | 5/2000 | Hashimoto et al. |
| 6,072,197 A * | 6/2000 | Horino ................. H01L 27/153 257/103 |
| 6,147,953 A | 11/2000 | Duncan |
| 6,153,010 A | 11/2000 | Kiyoku et al. |
| 6,195,381 B1 | 2/2001 | Botez et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,586,762 B2 | 7/2003 | Kozaki |
| 6,635,904 B2 | 10/2003 | Goetz et al. |
| 6,639,925 B2 | 10/2003 | Niwa et al. |
| 6,653,166 B2 * | 11/2003 | Ledentsov ............. B82Y 10/00 257/12 |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 * | 4/2006 | Chai ....................... C30B 25/02 117/101 |
| 7,053,413 B2 | 5/2006 | D'evelyn et al. |
| 7,063,741 B2 | 6/2006 | D'evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,564,387 B1 * | 7/2009 | Vawter ...................... G02F 7/00 341/137 |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 * | 3/2012 | Raring ................ H01S 5/34333 257/615 |
| 8,211,723 B2 * | 7/2012 | Feezell .................. B82Y 20/00 257/14 |
| 8,242,522 B1 * | 8/2012 | Raring .................. B82Y 20/00 257/13 |
| 8,247,887 B1 | 8/2012 | Raring et al. |
| 8,252,662 B1 | 8/2012 | Poblenz et al. |
| 8,254,425 B1 * | 8/2012 | Raring .................. B82Y 20/00 372/45.01 |
| 8,259,769 B1 | 9/2012 | Raring et al. |
| 8,284,810 B1 | 10/2012 | Sharma et al. |
| 8,294,179 B1 * | 10/2012 | Raring .................. B82Y 20/00 257/103 |
| 8,314,429 B1 | 11/2012 | Raring et al. |
| 8,350,273 B2 | 1/2013 | Vielemeyer |
| 8,351,478 B2 * | 1/2013 | Raring .................. B82Y 20/00 372/44.011 |
| 8,355,418 B2 * | 1/2013 | Raring .................. B82Y 20/00 372/44.011 |
| 8,416,825 B1 * | 4/2013 | Raring .................. B82Y 20/00 372/45.01 |
| 8,422,525 B1 * | 4/2013 | Raring .................. B82Y 20/00 257/26 |
| 8,427,590 B2 * | 4/2013 | Raring ................ H04N 9/3129 348/744 |
| 8,451,876 B1 * | 5/2013 | Raring .................. B82Y 20/00 372/45.01 |
| 8,509,275 B1 * | 8/2013 | Raring ................ F41H 13/0087 372/43.01 |
| 8,582,038 B1 * | 11/2013 | Raring ................ H04N 9/3129 348/744 |
| 8,634,442 B1 * | 1/2014 | Raring .................. H01S 5/0202 257/13 |
| 8,816,319 B1 * | 8/2014 | Raring ..................... H01L 33/06 257/13 |
| 9,071,039 B2 * | 6/2015 | Raring .................. H01S 5/0202 |
| 9,312,444 B2 * | 4/2016 | Sugawara ............. H01L 33/007 |
| 9,379,522 B1 * | 6/2016 | Raring ..................... H01L 33/06 |
| 9,570,888 B1 * | 2/2017 | Raring ..................... H01L 33/06 |
| 9,768,346 B2 * | 9/2017 | Han ....................... H01L 33/06 |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0167022 A1 * | 11/2002 | Ledentsov ............. B82Y 10/00 257/190 |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0087055 A1 * | 5/2004 | Ledentsov ............. B82Y 10/00 438/77 |
| 2004/0099213 A1 | 5/2004 | Adomaitis et al. |
| 2004/0104391 A1 | 6/2004 | Maeda et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |

(56) References Cited

U.S. PATENT DOCUMENTS

| | | |
|---|---|---|
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0033009 A1 | 2/2006 | Kobayashi et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | Leboeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1* | 4/2008 | Son ................. B82Y 20/00 385/14 |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1* | 8/2008 | Feezell ................. B82Y 20/00 257/13 |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0028204 A1 | 1/2009 | Hiroyama et al. |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'evelyn |
| 2009/0301388 A1 | 12/2009 | D'evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'evelyn |
| 2009/0321778 A1 | 12/2009 | Chen et al. |
| 2010/0001300 A1 | 1/2010 | Raring et al. |
| 2010/0003492 A1 | 1/2010 | D'evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'evelyn |
| 2010/0195687 A1 | 8/2010 | Okamoto et al. |
| 2010/0220262 A1 | 9/2010 | Demille et al. |
| 2010/0276663 A1 | 11/2010 | Enya et al. |
| 2010/0295054 A1 | 11/2010 | Okamoto et al. |
| 2010/0302464 A1* | 12/2010 | Raring ................. H04N 9/3129 348/744 |
| 2010/0309943 A1 | 12/2010 | Chakraborty et al. |
| 2010/0316075 A1* | 12/2010 | Raring ................. H01S 5/2201 372/44.011 |
| 2010/0327291 A1 | 12/2010 | Preble et al. |
| 2011/0031508 A1 | 2/2011 | Hamaguchi et al. |
| 2011/0056429 A1* | 3/2011 | Raring ................. C30B 25/02 117/101 |
| 2011/0057167 A1 | 3/2011 | Ueno et al. |
| 2011/0064100 A1* | 3/2011 | Raring ................. B82Y 20/00 372/44.011 |
| 2011/0064101 A1* | 3/2011 | Raring ................. B82Y 20/00 372/44.011 |
| 2011/0064102 A1* | 3/2011 | Raring ................. B82Y 20/00 372/44.011 |
| 2011/0075694 A1 | 3/2011 | Yoshizumi et al. |
| 2011/0103418 A1* | 5/2011 | Hardy ................. B82Y 20/00 372/44.01 |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1* | 7/2011 | Raring ................. H01L 27/156 257/13 |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1* | 11/2011 | Raring ................. B82Y 20/00 372/44.011 |
| 2012/0104359 A1 | 5/2012 | Felker et al. |
| 2012/0178198 A1* | 7/2012 | Raring ................. H01S 5/34333 438/46 |
| 2012/0187371 A1 | 7/2012 | Raring et al. |
| 2012/0256158 A1* | 10/2012 | Feezell ................. B82Y 20/00 257/9 |
| 2012/0314398 A1 | 12/2012 | Raring et al. |
| 2013/0016750 A1 | 1/2013 | Raring et al. |
| 2013/0022064 A1* | 1/2013 | Raring ................. H01S 5/34333 372/29.013 |
| 2013/0044782 A1* | 2/2013 | Raring ................. B82Y 20/00 372/45.012 |
| 2013/0064261 A1 | 3/2013 | Sharma et al. |

(56) References Cited

U.S. PATENT DOCUMENTS

2013/0234111 A1    9/2013  Pfister et al.
2014/0295595 A1*  10/2014  Raring .................. H01S 5/0202
                                                                  438/29

FOREIGN PATENT DOCUMENTS

| CN | 1702836 | 11/2005 |
|---|---|---|
| CN | 101009347 | 8/2007 |
| CN | 101079463 | 11/2007 |
| CN | 101099245 | 1/2008 |
| JP | 03287770 | 12/1991 |
| JP | 09036430 | 2/1997 |
| JP | 2000294883 | 10/2000 |
| JP | 2001160627 | 6/2001 |
| JP | 2002185085 | 6/2002 |
| JP | 2006173621 | 6/2006 |
| JP | 2007068398 | 3/2007 |
| JP | 2007173467 | 7/2007 |
| JP | 2008311640 | 12/2008 |
| WO | 2008041521 | 4/2008 |
| WO | 2010138923 | 2/2010 |
| WO | 2010120819 | 10/2010 |

OTHER PUBLICATIONS

Abare et al., Cleaved and Etched Facet Nitride Laser Diodes, IEEE Journal of Selected Topics in Quantum Electronics, vol. 4, No. 3, May 1998, pp. 505-509.
Adesida et al., Characteristics of chemically assisted ion beam etching of gallium nitride, Applied Physics Letters, vol. 65, No. 7, 1994, pp. 889-891.
Aoki et al., InGaAs/InGaAsP MQW electroabsorption modulator integrated with a DFB laser fabricated by band-gap energy control selective area MOCVD, IEEE Journal of Quantum Electronics, vol. 29, No. 6, Jun. 1993, pp. 2088-2096.
Asano et al., 100-mW kink-free blue-violet laser diodes with low aspect ratio, IEEE Journal of Quantum Electronics, vol. 39, No. 1, Jan. 2003, pp. 135-140.
Behfar et al., Progress in Etched Facet Technology for GaN and Blue Lasers, Proc. SPIE 6473, Gallium Nitride Materials and Devices II, 64731F vol. 6473, 2007, 8 pages.
Bernardini et al., Spontaneous polarization and piezoelectric constants of III-V nitrides, Physical Review B, vol. 56, No. 16, Oct. 15, 1997, pp. 10024-10027.
Caneau et al., Studies on the selective OMVPE of (Ga,In)/(As,P), Journal of Crystal Growth, vol. 124, No. 1-4, Nov. 1, 1992, pp. 243-248.
Chen et al., Growth and Optical Properties of Highly Uniform and Periodic InGaN Nanostructures, Advanced Materials, vol. 19, Jun. 5, 2007, pp. 1707-1710.
D'Evelyn et al., Bulk GaN crystal growth by the high-pressure ammonothermal method, Journal of Crystal Growth, vol. 300, Issue 1, Mar. 1, 2007, pp. 11-16.
Enya et al., 531nm Green Lasing of InGaN Based Laser Diodes on Semi-Polar {20-21} Free-Standing GaN Substrates, Applied Physics Express, vol. 2, Jul. 2009, pp. 082101.
Founta et al., Anisotropic Morphology of Nonpolar a-Plan GaN Quantum Dots and Quantum Wells, Journal of Applied Physics, vol. 102, No. 7, 2007, pp. 074304-1-074304-6.
Franssila, Tools for CVD and Epitaxy, Introduction to Microfabrication, 2004, pp. 329-336.
Fujii et al., Increase in the extraction efficiency of GaN-based light-emitting diodes via surface roughening, Applied Physics Letters, vol. 84, No. 6, 2004, pp. 855-857.
Funato et al., Blue, Green, and Amber InGaN/GaN Light-Emitting Diodes on Semipolar {11-22} GaN Bulk Substrates, Journal of Japanese Applied Physics, vol. 45, No. 26, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.

Gardner et al., Blue-emitting InGaN—GaN double-heterostructure light-emitting diodes reaching maximum quantum efficiency above 200A/cm2, Applied Physics Letters, vol. 91, Dec. 12, 2007, pp. 243506-1-243506-3.
Hiramatsu et al., Selective area growth and epitaxial lateral overgrowth of GaN by metalorganic vapor phase epitaxy and hydride vapor phase epitaxy, Materials Science and Engineering B, vol. 59, May 6, 1999, pp. 104-111.
Iso et al., High Brightness Blue InGaN/GaN Light Emitting Diode on Nonpolar m-plane Bulk GaN Substrate, Japanese Journal of Applied Physics, vol. 46, No. 40, 2007, pp. L960-L962.
Kendall et al., Energy Savings Potential of Solid State Lighting in General Lighting Applications, Report for the Department of Energy, 2001, 35 pages.
Khan, Cleaved cavity optically pumped InGaN—GaN laser grown on spinel substrates, Applied Physics Letters, vol. 69, Issue 16, Oct. 14, 1996, pp. 2418-2420.
Kim et al., Improved Electroluminescence on Nonpolar m-plane InGaN/GaN Qantum Well LEDs, Physica Status Solidi (RRL), vol. 1, No. 3, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.
Lin et al., Influence of Separate Confinement Heterostructure Layer on Carrier Distribution in InGaAsP Laser Diodes with Nonidentical Multiple Quantum Wells, Japanese Jouranal of Appliedd Physics, vol. 43, No. 1 0, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, Part 1, No. 11, 2007, pp. 7309-7310.
Michiue et al., Recent development of nitride LEDs and LDs, Proceedings of SPIE, vol. 7216, 2009, pp. 721612-1-721612-6.
Nakamura et al., InGaN/GaN/AlGaN-based laser diodes with modulation-doped strained-layer superlattices grown on an epitaxially laterally overgrown GaN substrate, Applied Physics Letters, vol. 72, No. 12, 1998, pp. 211-213.
Nam et al., Lateral epitaxial overgrowth of GaN films on SiO2 areas via metalorganic vapor phase epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics JJAP Express LEtter, vol. 46 No. 9, 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express 1, Jun. 20, 2008, pp. 0722011-072201-3.
Okamoto et al., Pure Blue Laser Diodes Based on Nonpolar m-Piane Gallium Nitride with InGaN Waveguiding Layers, Journal of Japanese Applied Physics, vol. 46, No. 35, 2007, pp. L820-L822.
Park, Crystal orientation effects on electronic properties of wurtzite InGaN/GaN quantum wells, Journal of Applied Physics, vol. 91, No. 12, Jun. 15, 2002, pp. 9904-9908.
Purvis, Changing the crystal face of gallium nitride, The Advance Semiconductor Magazine, III-Vs Review, vol. 18, No. 8, Nov. 8, 2005, pp. 26-28.
Romanov et al., Strain-induced polarization in wurtzite III-nitride semipolar layers, J. Appl. Phys., vol. 100, Jul. 25, 2006, pp. 023522-1-023522-10.
Sato et al., High Power and High Efficiency Green Light Emitting Diode on free-Standing Semipolar (1122) Bulk GaN Substrate, Physica Status Solidi (RRL), vol. 1, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.
Schmidt et al., Demonstration of Nonpolar m-Plane InGaN/GaN Laser Diodes, Japanese Journal of Applied Physics, vol. 46 Part 2, 2007, pp. 190-191.
Schmidt et al., High Power and High External Efficiency m-plane InGaN Light Emitting Diodes, Japanese Journal of Applied Physics, vol. 46, No. 7, Feb. 9, 2007, pp. L126-L128.

(56) References Cited

OTHER PUBLICATIONS

Schoedl, Facet degradation of GaN heterostructure laser diodes, Journal of Applied Physics, vol. 97, No. 12, 2005, pp. 123102-1 to123102-8.

Shchekin et al., High Performance Thin-film Flip-Chip InGaN—GaN Light-emitting Diodes, Applied Physics Letters, vol. 89, Aug. 16, 2006, pp. 071109-1-071109-3.

Shen et al., Auger recombination in InGaN measured by photoluminescence, Applied Physics Letters, vol. 91, Oct. 1, 2007, pp. 141101-1-141101-3.

Sizov et al., 500-nm Optical Gain Anisotropy of Semipolar (1122) InGaN Quantum Wells, Applied Physics Express, vol. 2, Jun. 19, 2009, pp. 071001-1-071001-3.

Tomiya et al., Dislocation related issues in the degradation of GaN-based laser diodes, IEEE Journal of Selected Topics in Quantum Electronics, vol. 10, Issue 6, Nov.-Dec. 2004, pp. 1277-1286.

Tyagi et al., High Brightness Violet InGan/Gan Light EMitting Diodes on Semipolar (1011) Bulk Gan Substrates, Japanese Journal of Applied Physics, vol. 46, No. 4-7, Feb. 9, 2007, pp. L129-L131.

Tyagi et al., Semipolar (1011) InGaN/GaN Laser Diodes on Bulk GaN Substrates, Japanese Journal of Applied Physics, vol. 46, Issue No. 19, 2007, pp. L444-L445.

Uchida et al., Recent progress in high-power blue-violet lasers, IEEE Journal of Selected Topics in Quantum Electronics, vol. 9, Issue 5, Sep.-Oct. 2003, pp. 1252-1259.

Waltereit et al., Nitride semiconductors free of electrostatic fields for efficient white light-emitting diodes, Nature, vol. 406, Aug. 24, 2000, pp. 865-868.

Wierer et al., High-power AlGaInN flip-chip light-emitting diodes, Applied Physics Letters, vol. 78, No. 22, 2001, pp. 3379-3381.

Yamaguchi, Anisotropic optical matrix elements in strained GaN-quantum wells with various substrate orientations, Physica Status Solidi (PSS), vol. 5, No. 6, May 2008, pp. 2329-2332.

Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.

Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, pp. 1-2.

Zhong et al., Demonstration of High Power Blue-Green Light Emitting Diode on Semipolar (1122) bulk GaN substrate, Electronics Letters, vol. 43, No. 15, Jul. 2007, pp. 825-826.

Zhong et al., High power and high efficiency blue light emitting diode on freestanding semipolar (1011) bulk GaN substrate, Applied Physics Letter, vol. 90, No. 23, 2007, pp. 233504-1-233504-3.

International Application No. PCT/US2009/046786, International Search Report dated May 13, 2010, 2 pp.

International Application No. PCT/US2009/047107, International Search Report dated Sep. 29, 2009, 4 pages.

International Application No. PCT/US2009/052611, International Search Report dated Sep. 29, 2009, 3 pages.

International Application No. PCT/US2010/030939, International Search Report and Written Opinion dated Jun. 16, 2010, 9 pages.

International Application No. PCT/US2010/049172, International Search Report and Written Opinion dated Nov. 17, 2010, 7 pages.

International Application No. PCT/US2011/037792, International Preliminary Report on Patentability dated Sep. 8, 2011, 13 pages.

International Application No. PCT/US2011/037792, International Search Report and Written Opinion dated Sep. 8, 2011, 2 pages.

International Application No. PCT/US2011/060030, International Preliminary Report on Patentability dated May 23, 2013, 7 pages.

International Application No. PCT/US2011/060030, International Search Report and Written Opinion dated Mar. 21, 2012, 8 pages.

U.S. Appl. No. 13/288,268, Non-Final Office Action dated Nov. 22, 2013, 9 pages.

U.S. Appl. No. 13/288,268, Notice of Allowance dated Apr. 21, 2014, 7 pages.

U.S. Appl. No. 14/444,687, Notice of Allowance dated Mar. 3, 2016, 10 pages.

U.S. Appl. No. 14/444,687, Restriction Requirement dated Dec. 11, 2015, 7 pages.

U.S. Appl. No. 15/177,956, Notice of Allowance dated Oct. 5, 2016, 12 pages.

\* cited by examiner

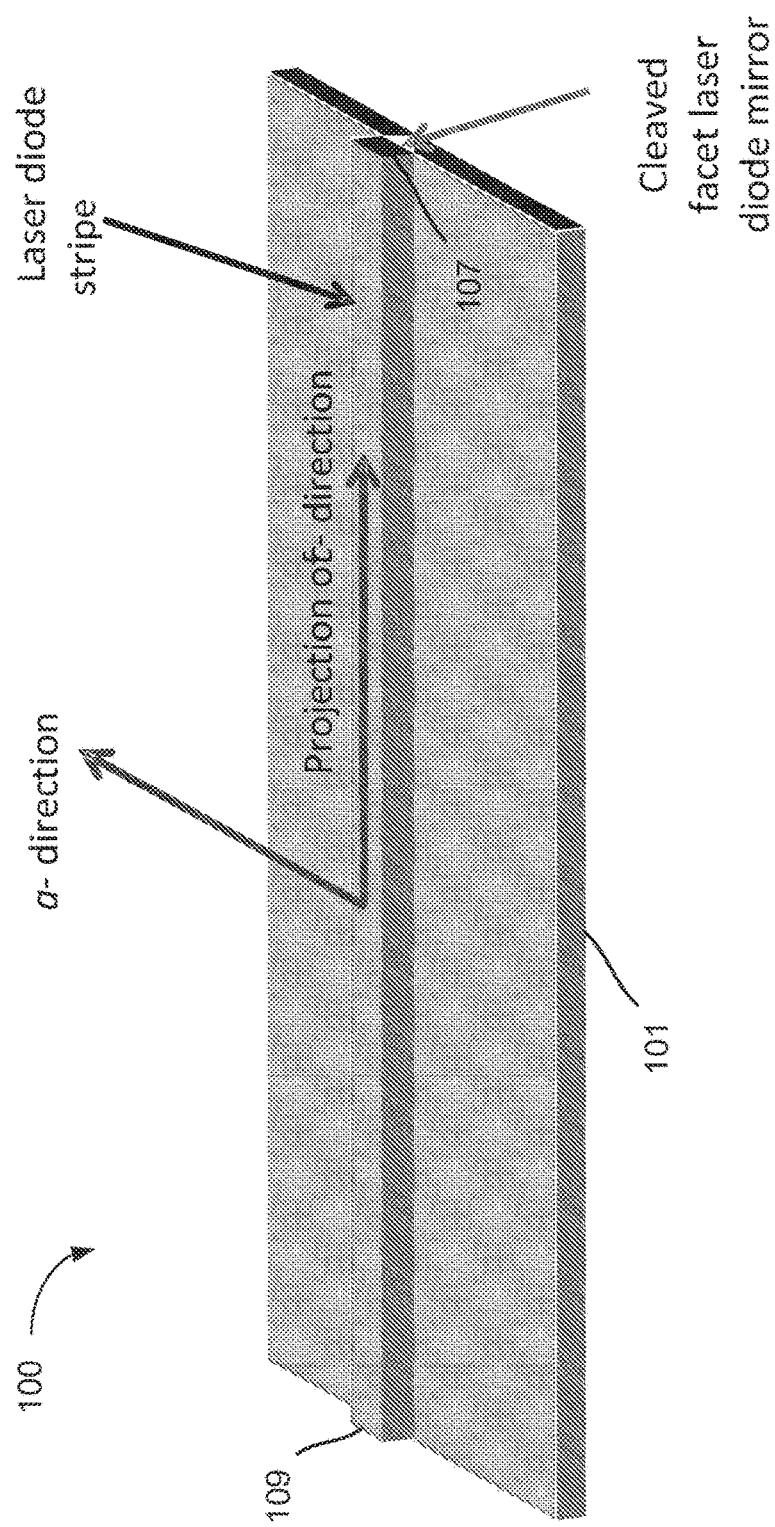
Figure 1: Projection of c-direction laser diode on {20-21} GaN substrate with cleaved mirror 202 = high indium content and/or thick InGaN layer
204 = strain control region

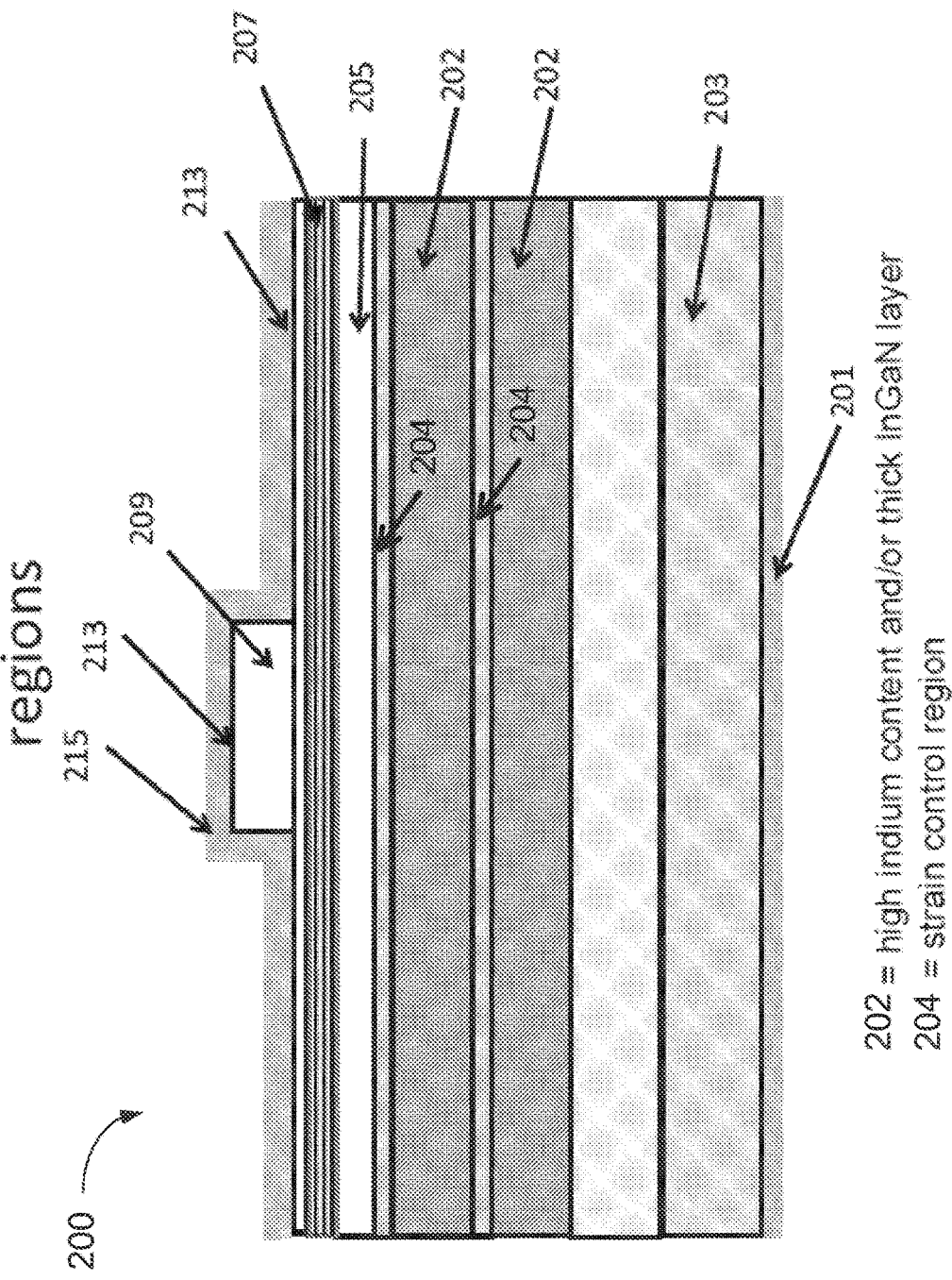
Figure 2b-Multiple InGaN layers and strain control regions

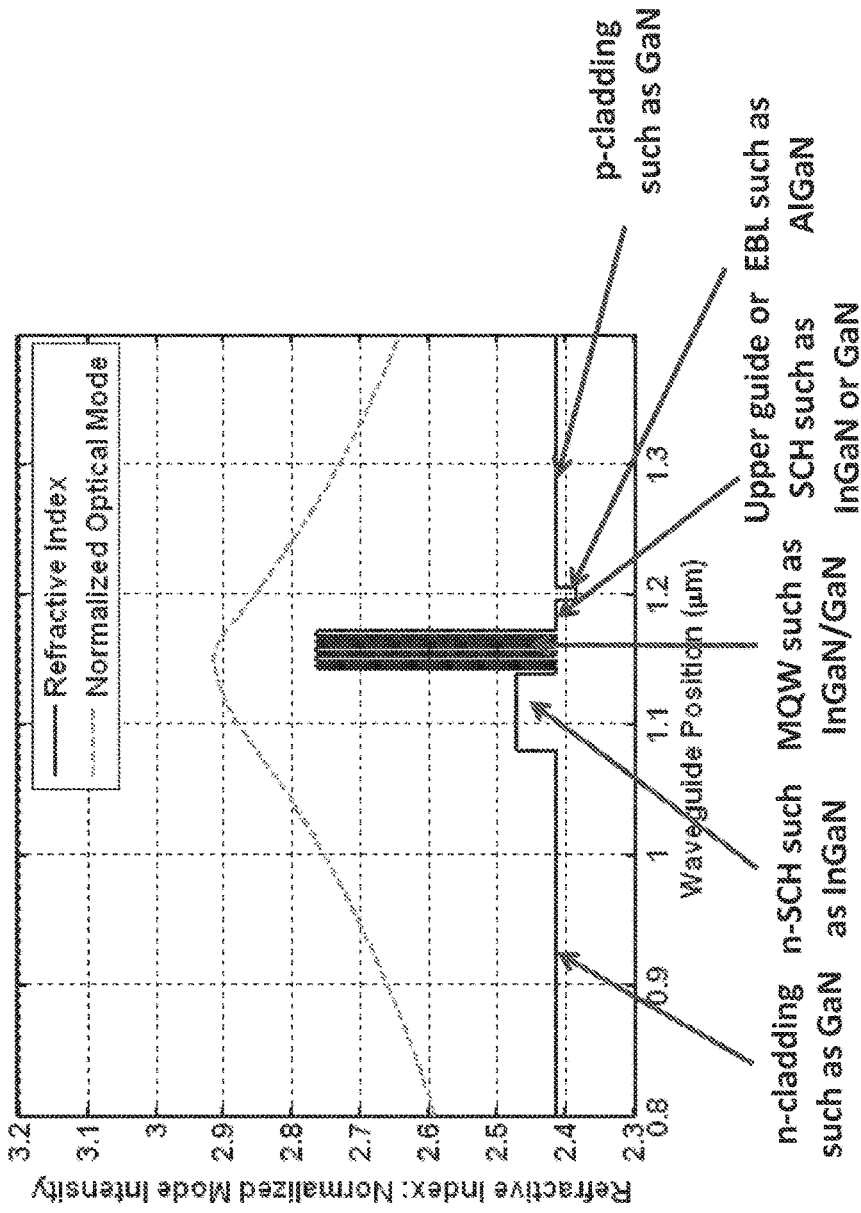
Figure 3: Example LD Active Region Design-Base

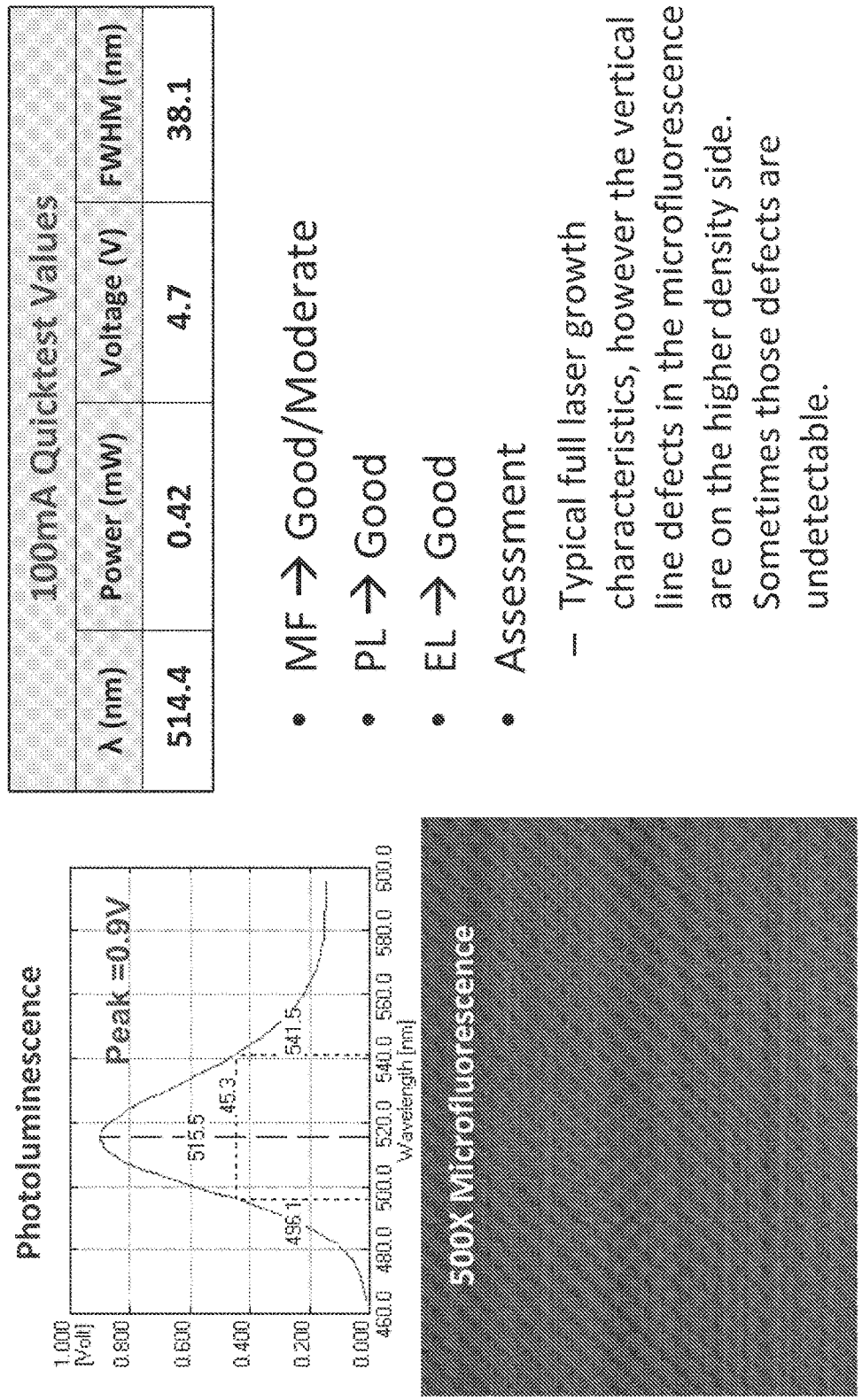
Figure 4: Example LD Growth Characteristics-Base

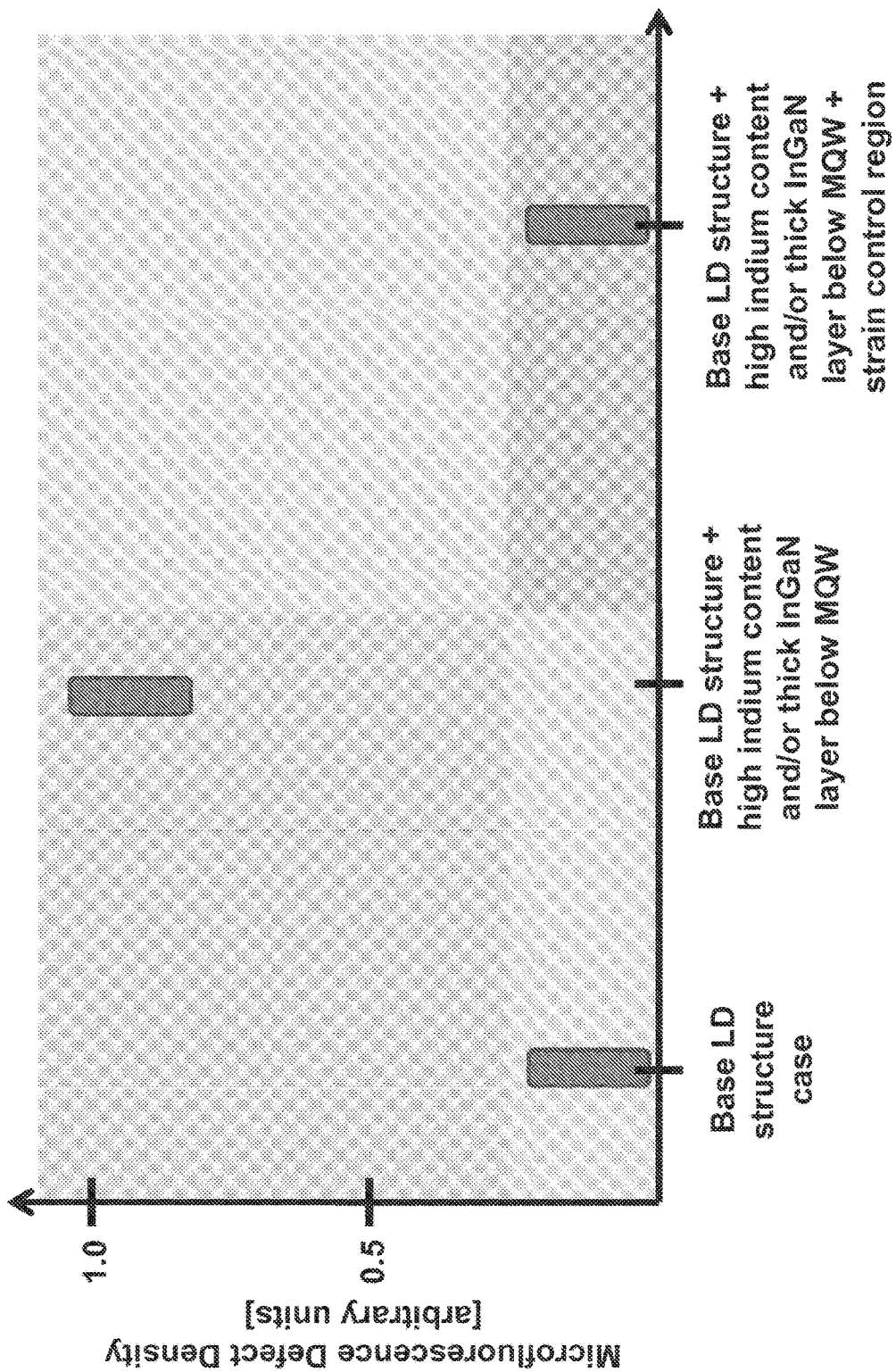

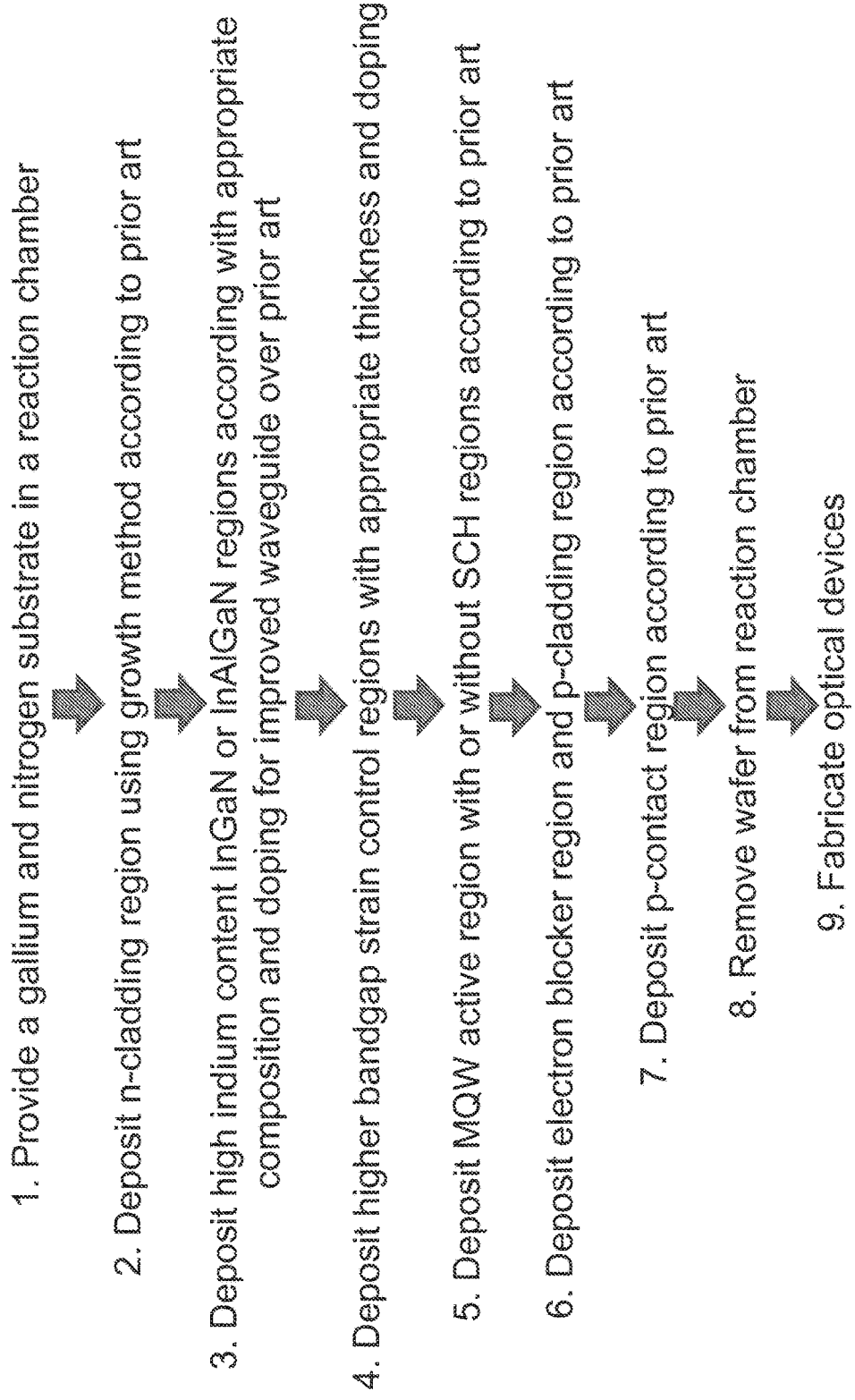

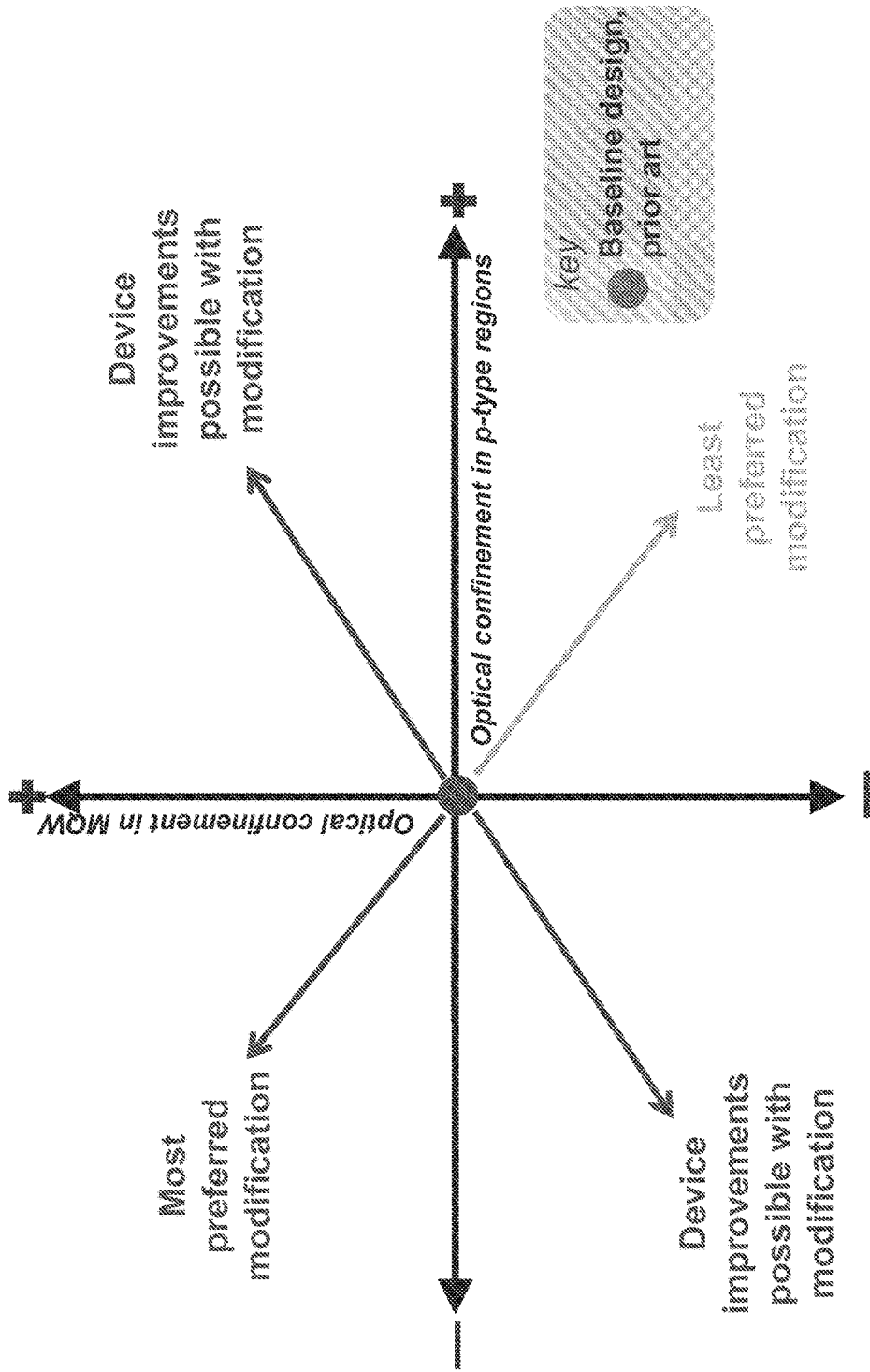
Figure 7: Schematic illustrating how invention can modify waveguide characteristics

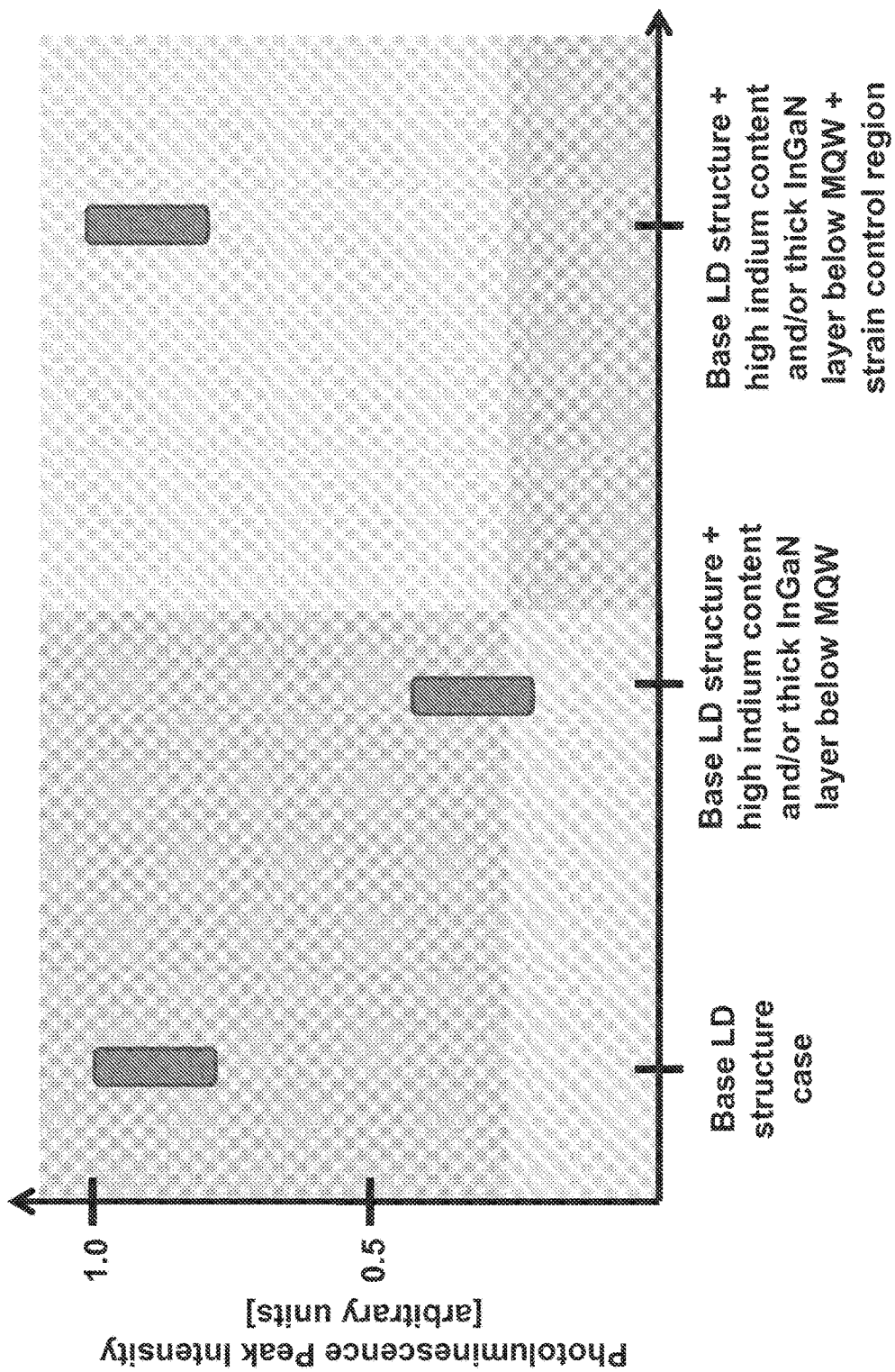

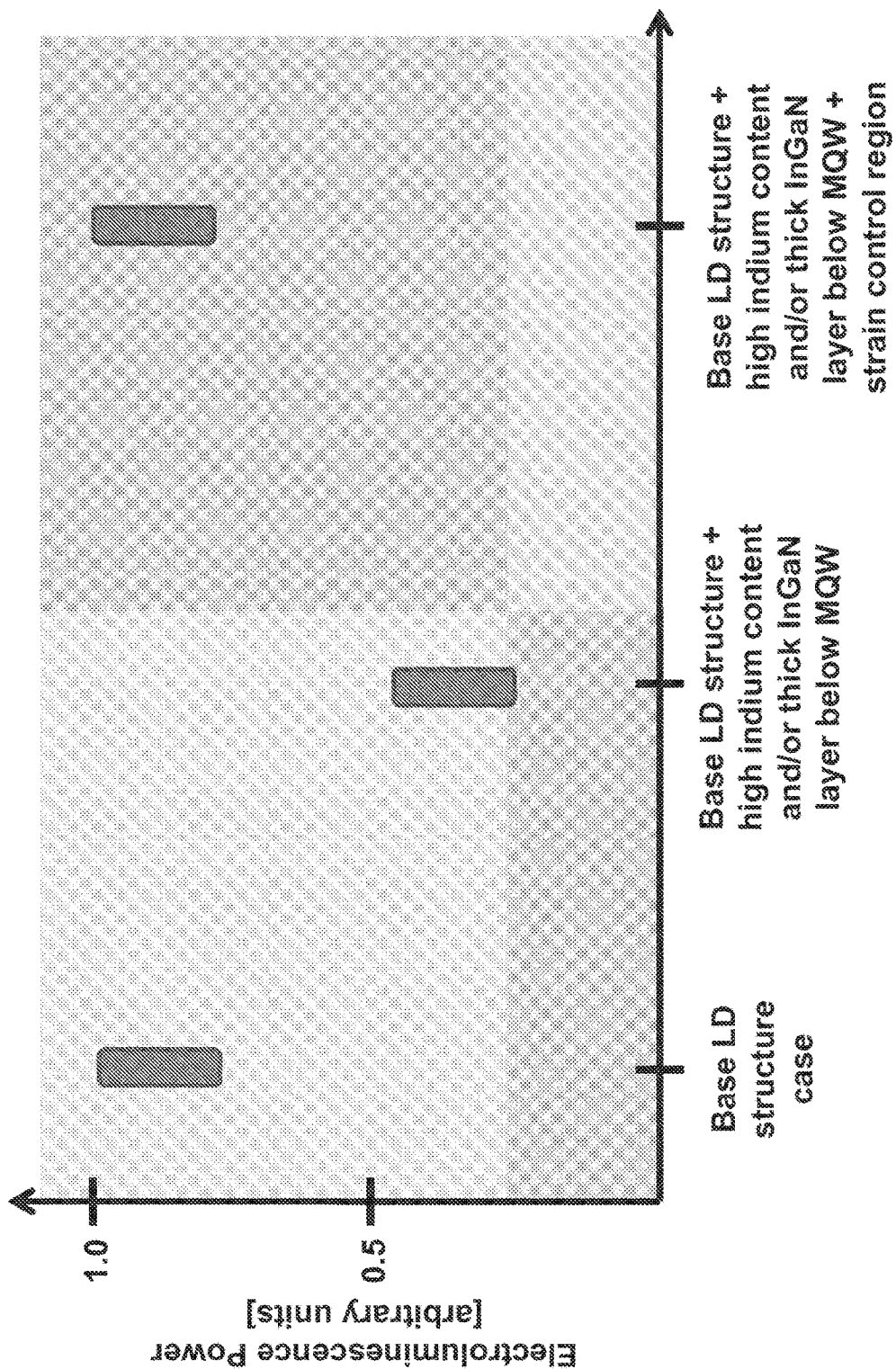

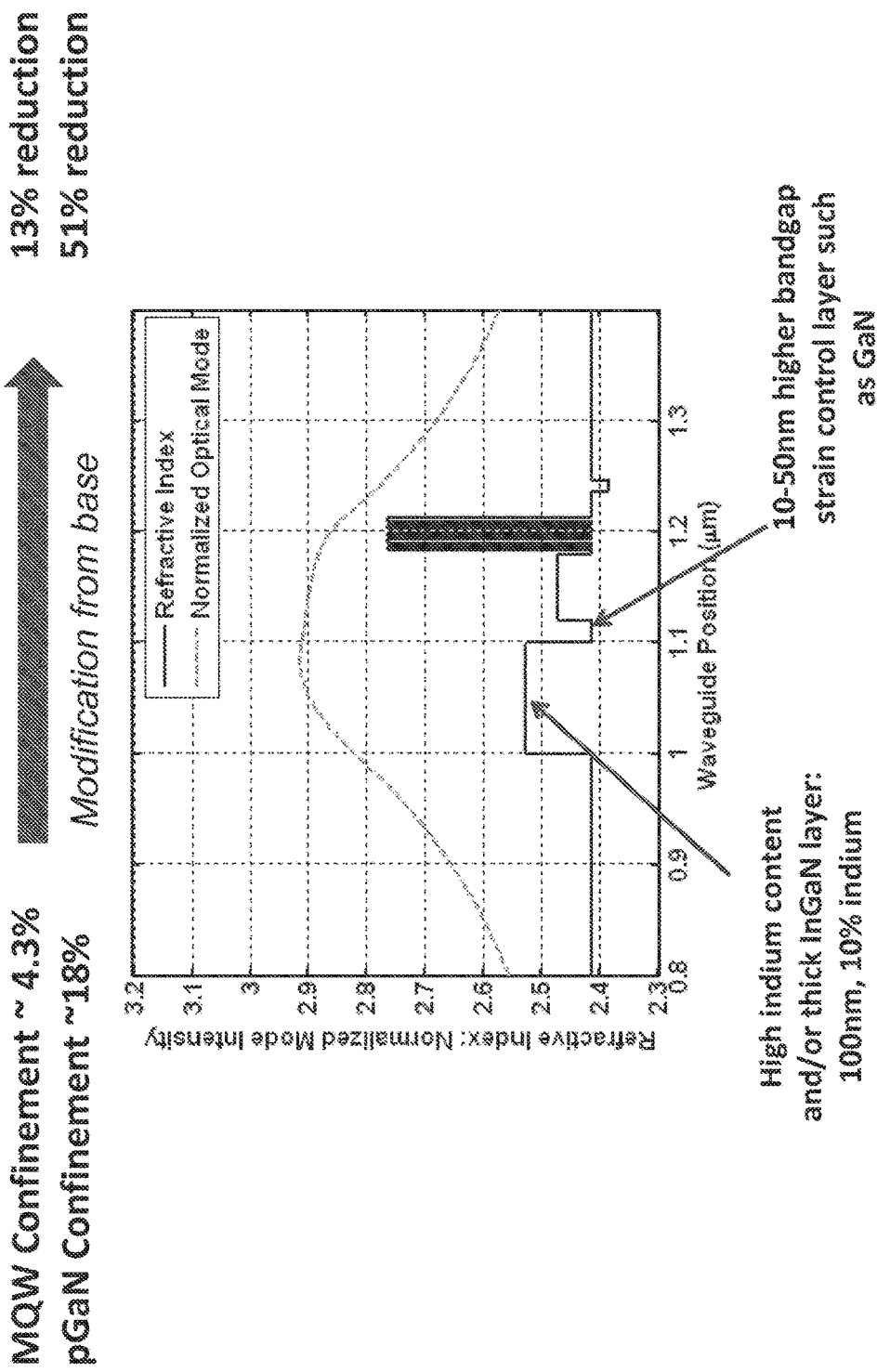
Figure 10: Example variant 1-Improved pGaN confinement

Figure 11: Growth data from example variant 1
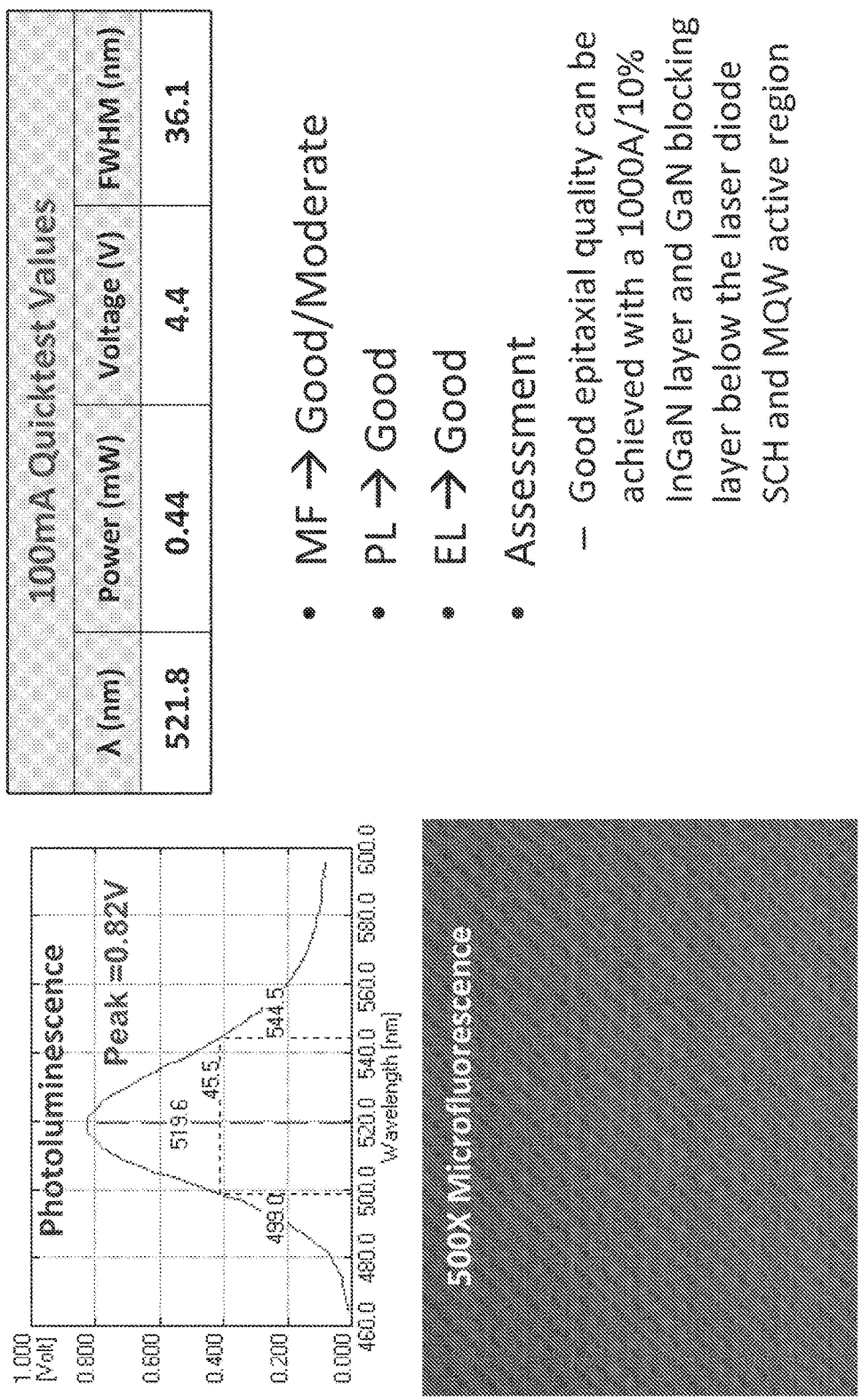

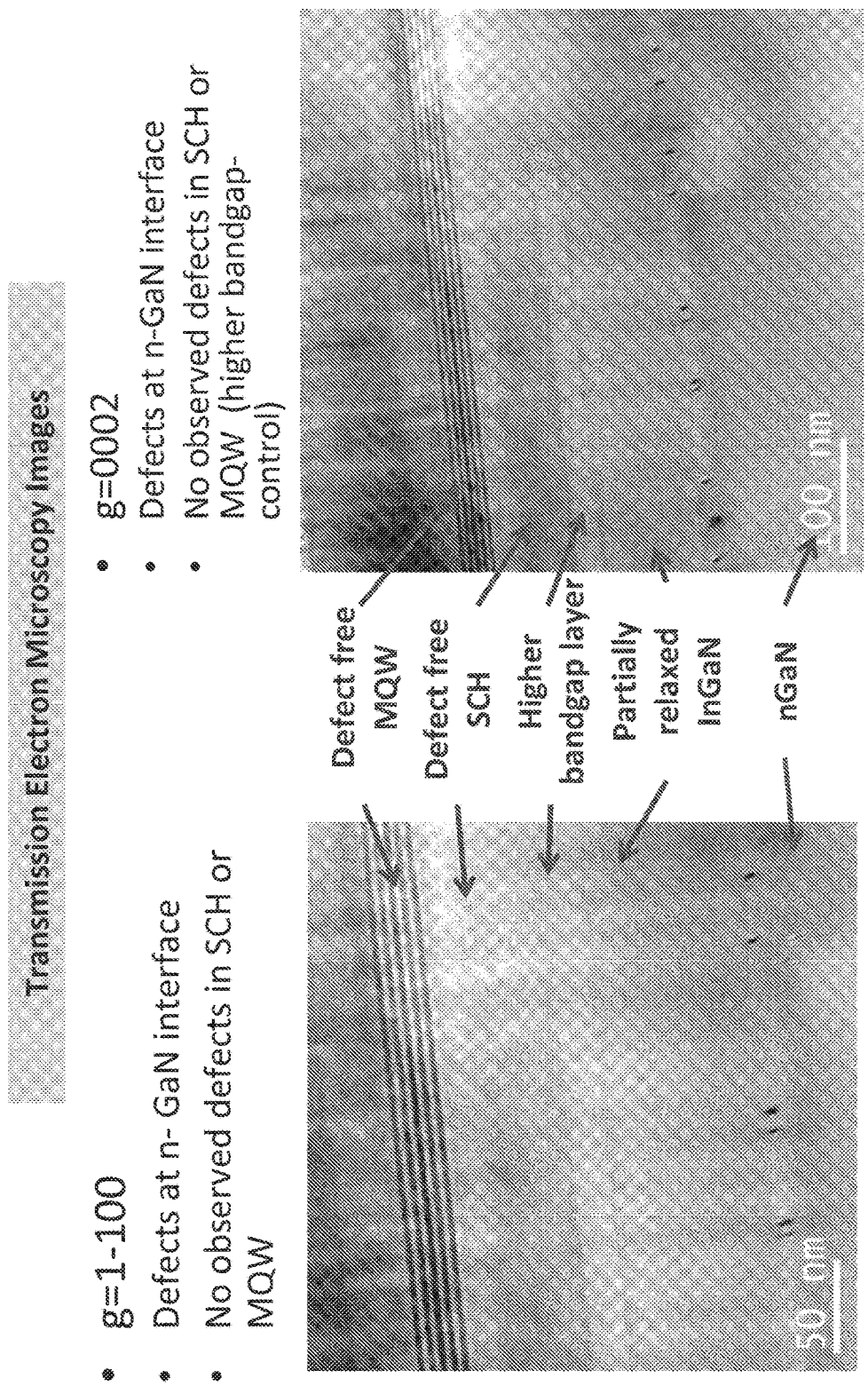
Figure 12: TEM images from example variant 1

Figure 13: Absence of Higher Bandgap Layer
- With higher bandgap layer above partially relaxed layer
  — Sparse defects
- Without higher bandgap layer
  — Heavily defected
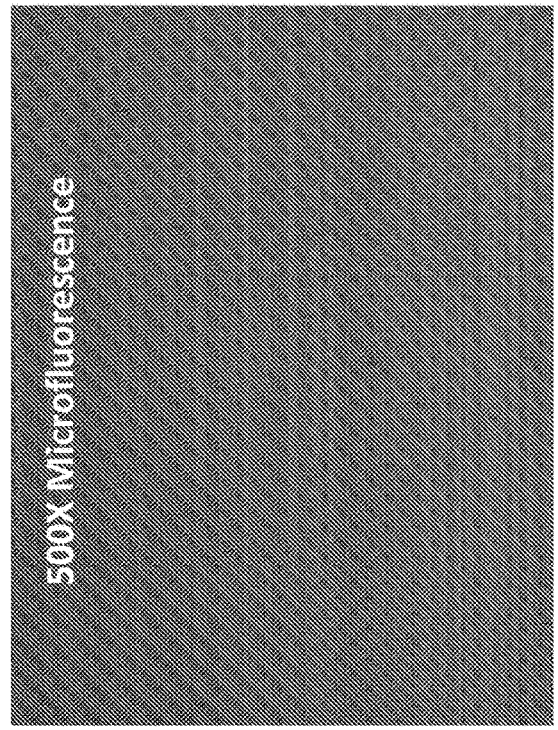
Higher bandgap layer plays key role in suppressing defects in MQW

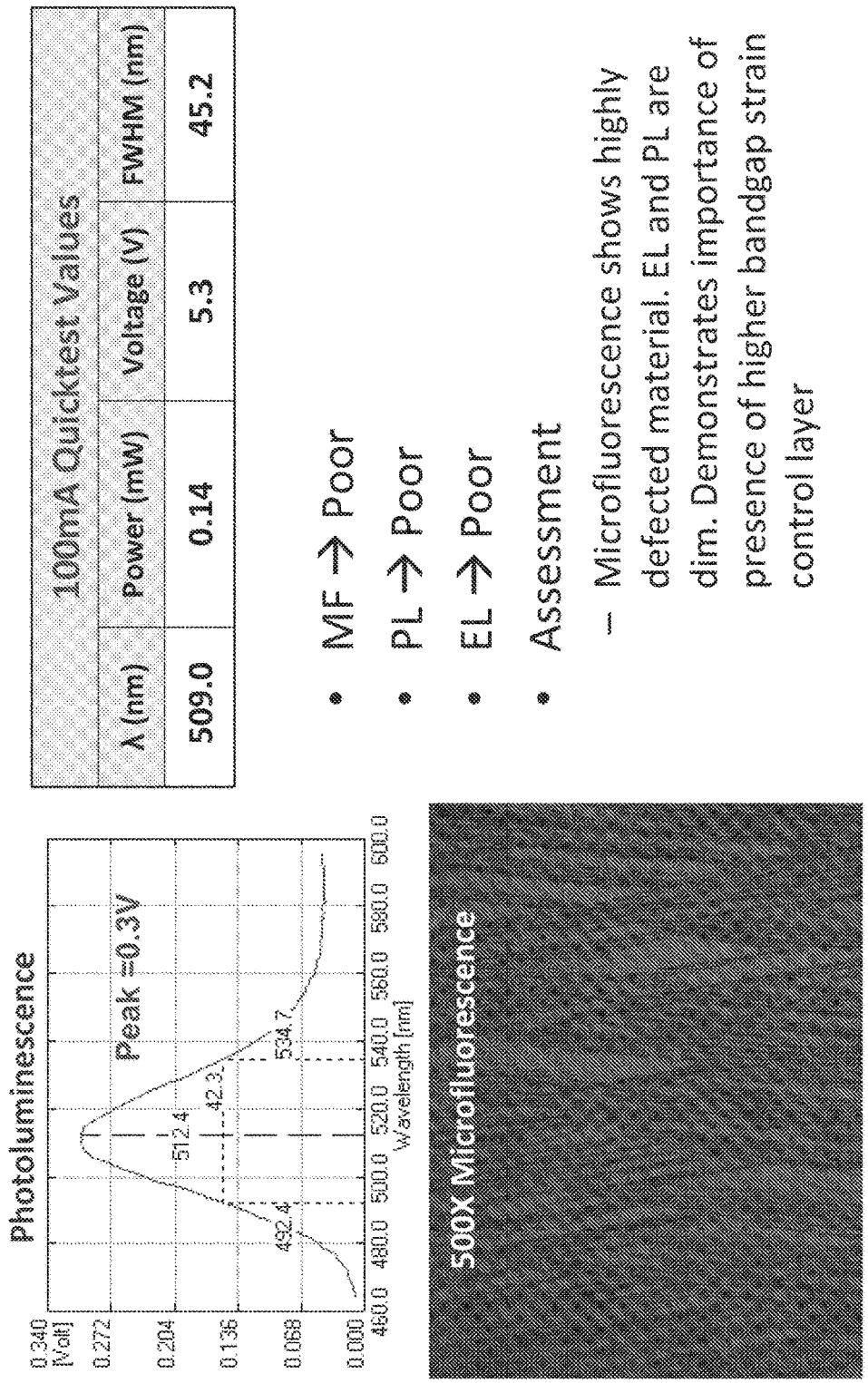
Figure 14: Growth data from variant 1 without higher bandgap layer (lower PL)

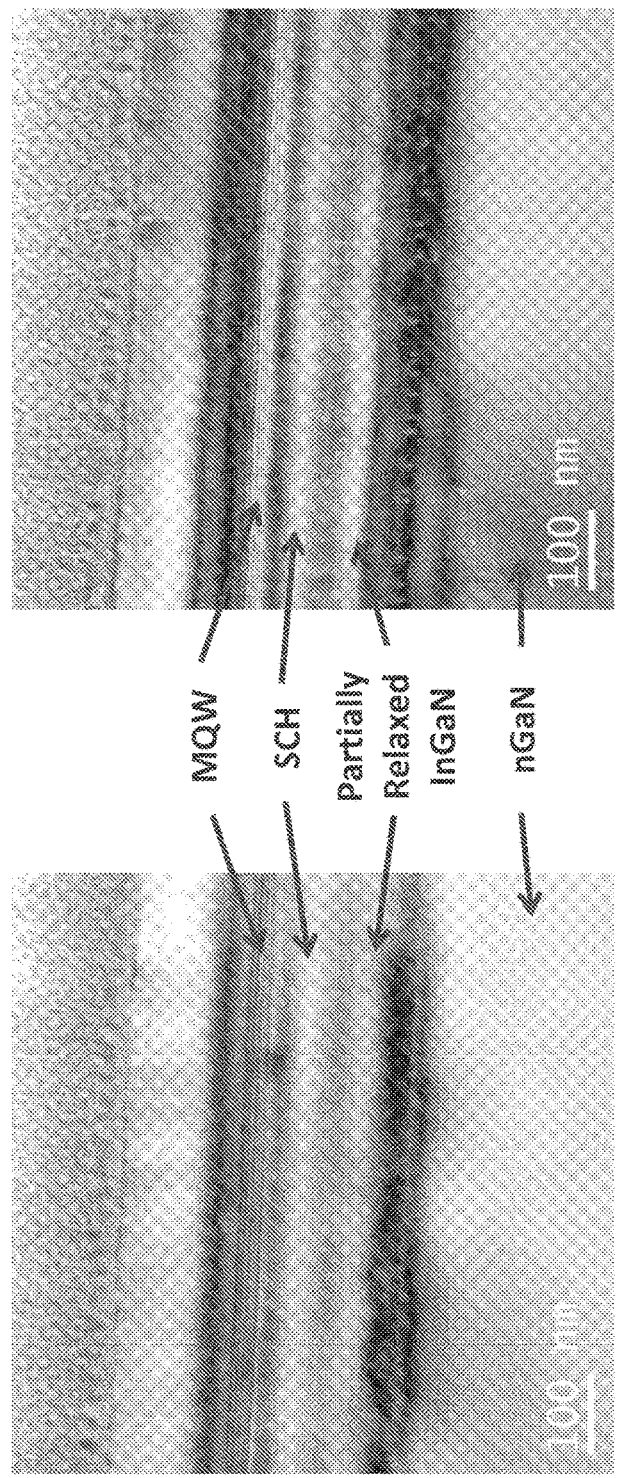
Figure 15a: TEM images from example variant 1 with no higher bandgap layer

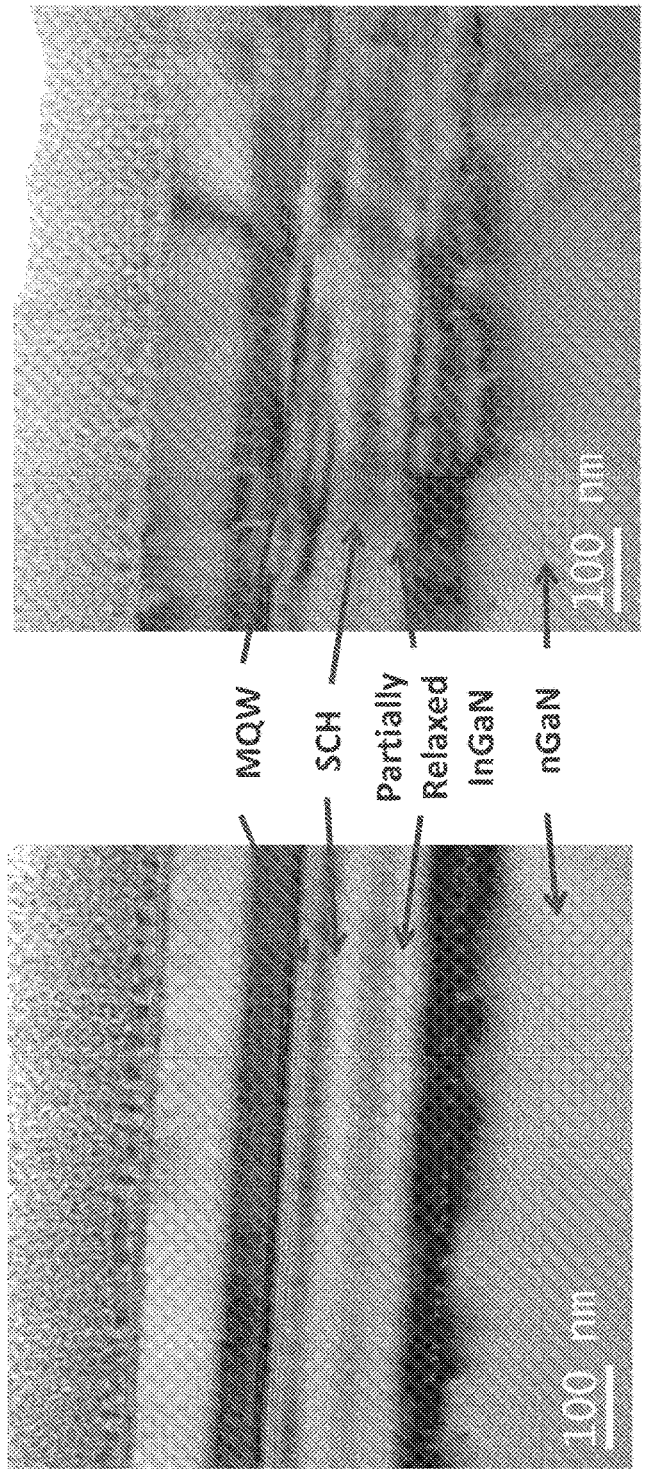
Figure 15b: TEM images from example variant 1 with no higher bandgap layer

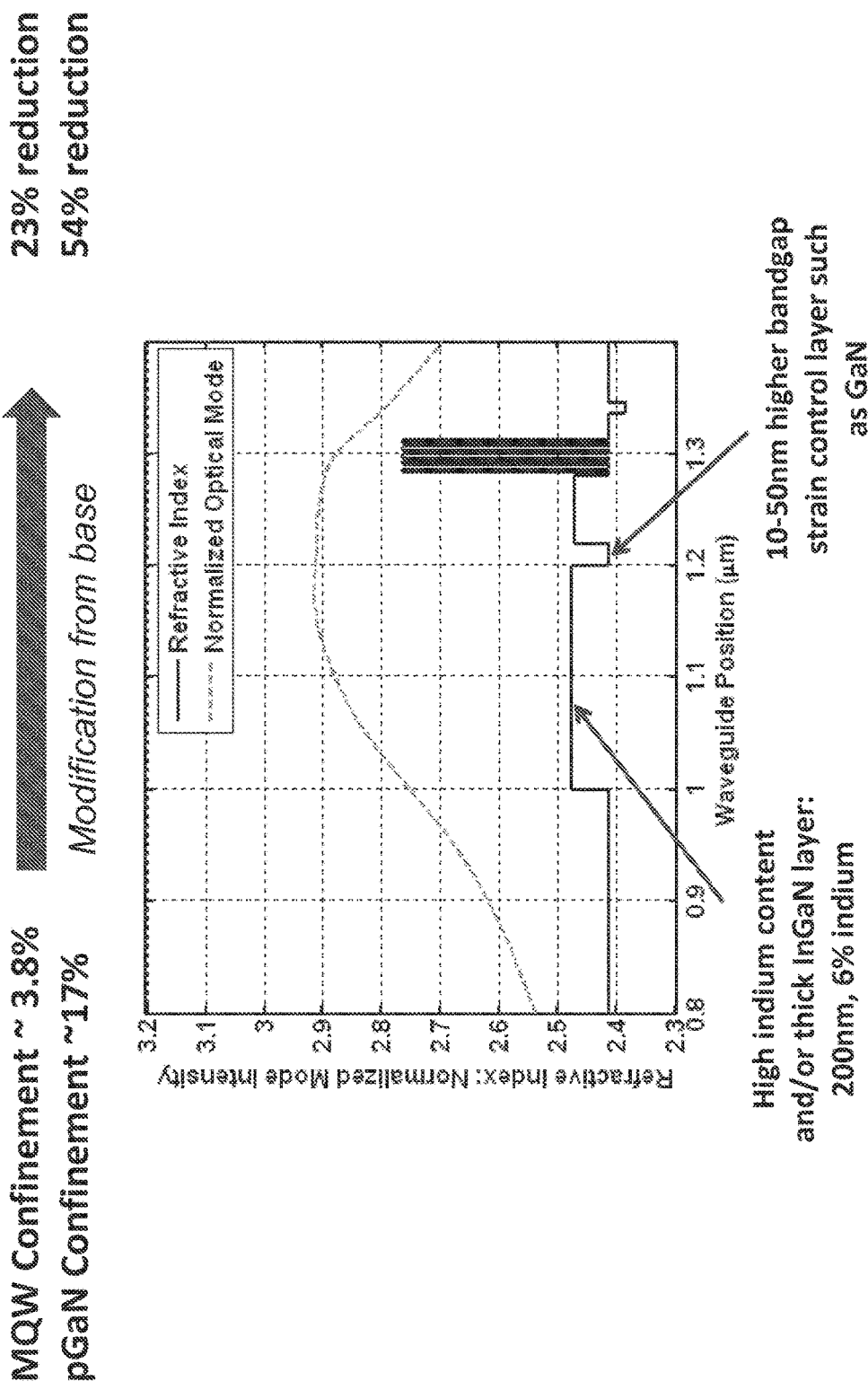
Figure 16: Example variant 2

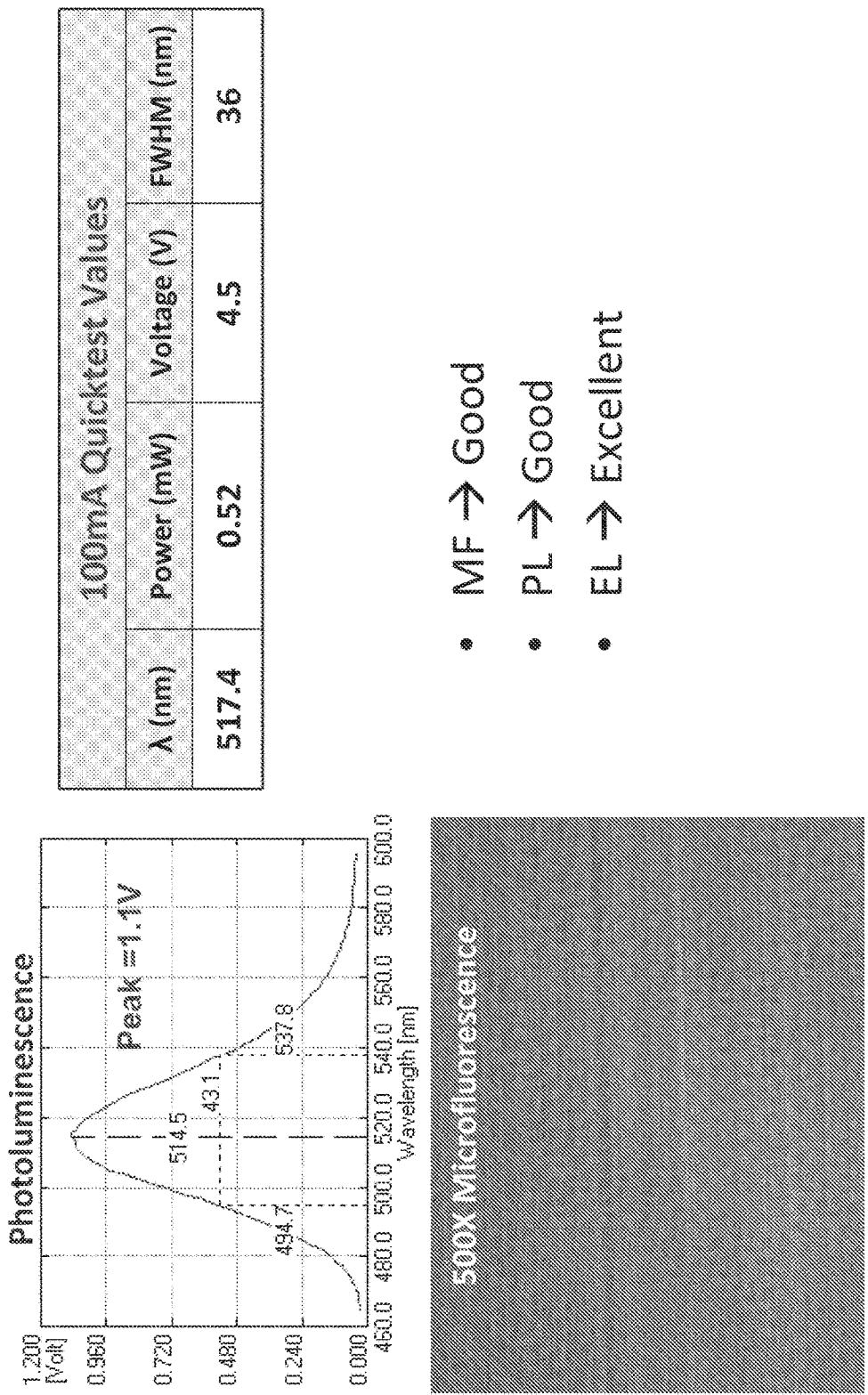
Figure 17: Example variant 2 growth results

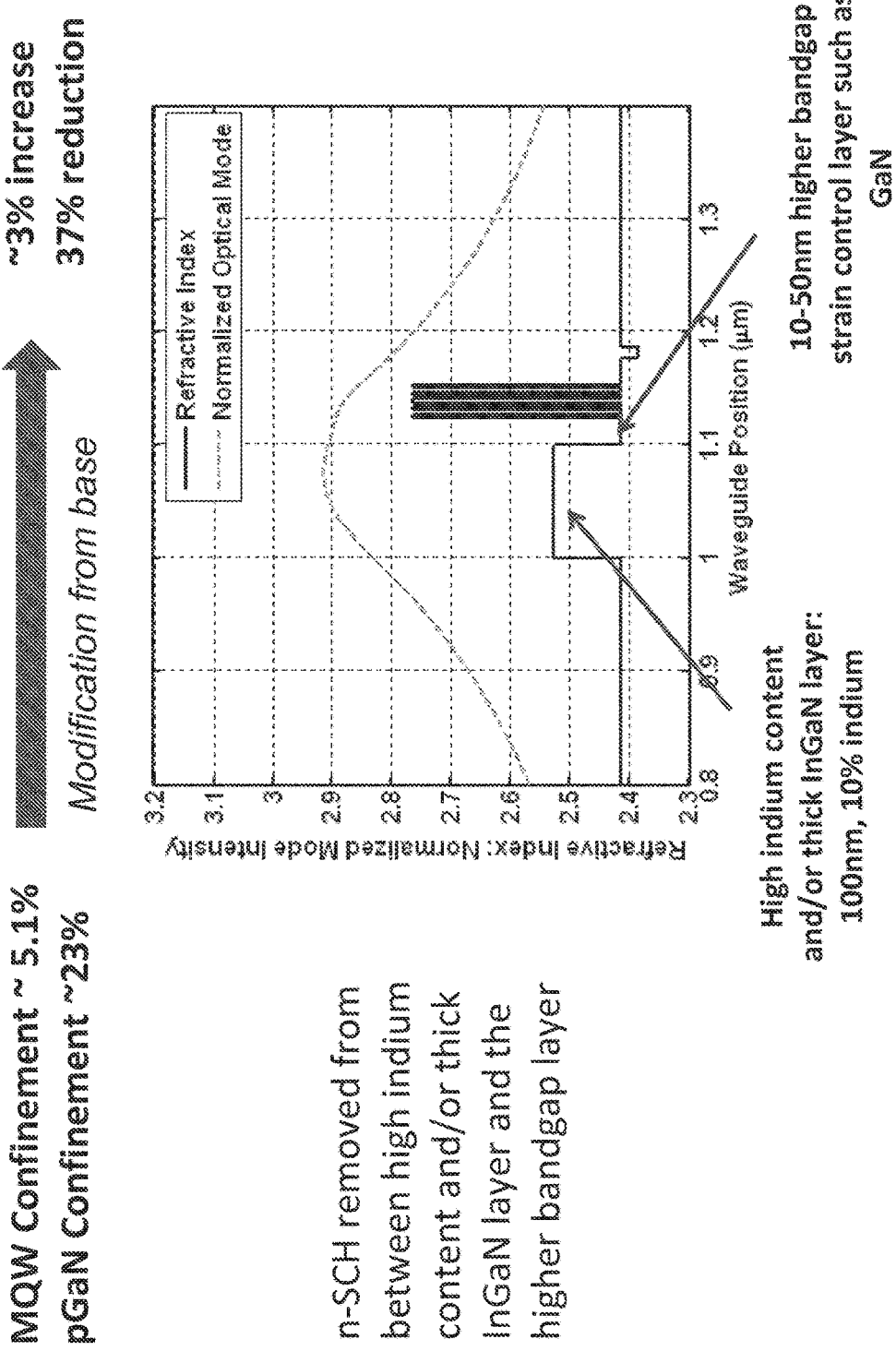
Figure 18: Example variant 3 – both right direction

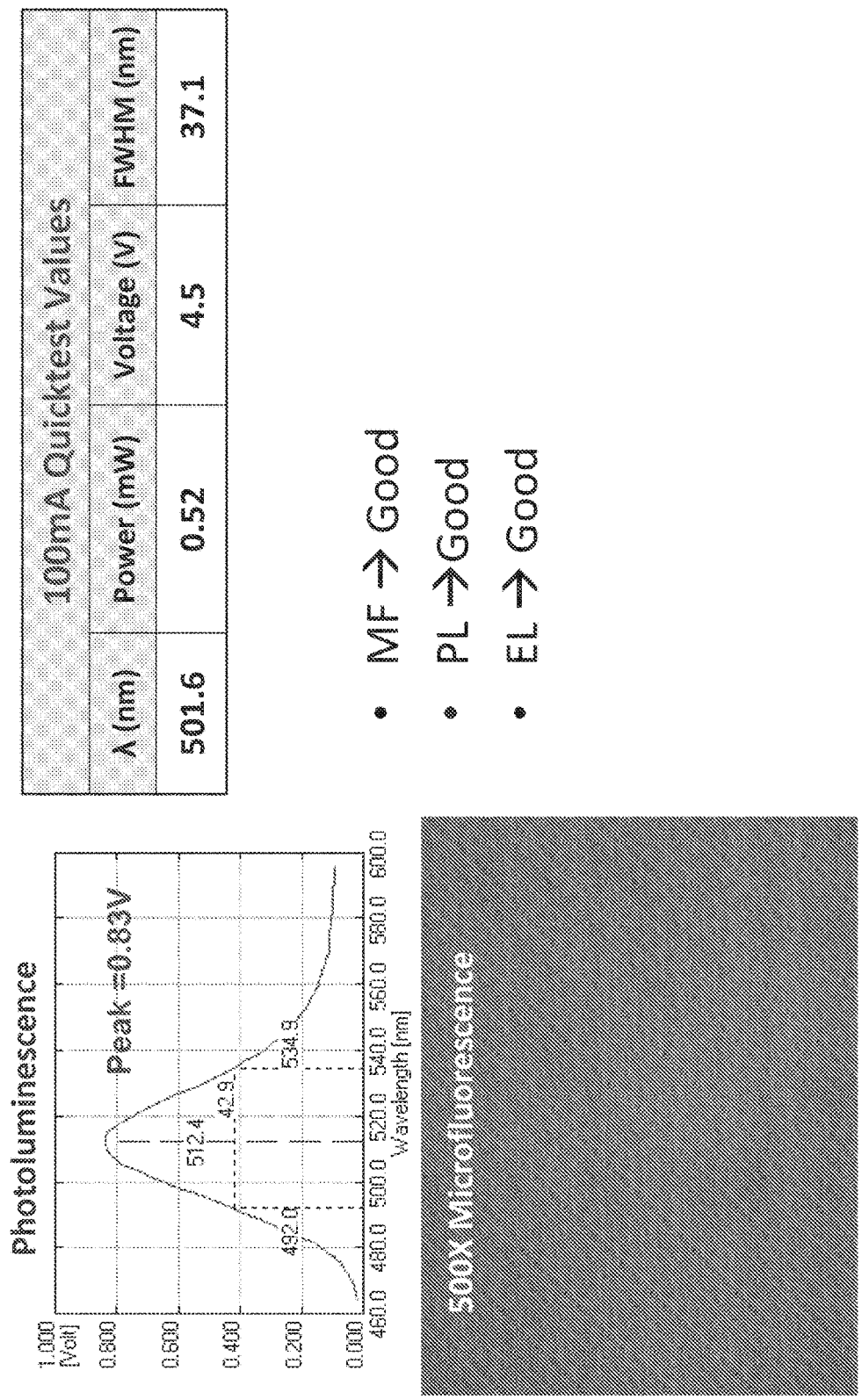
Figure 19: Growth data from example variant 3

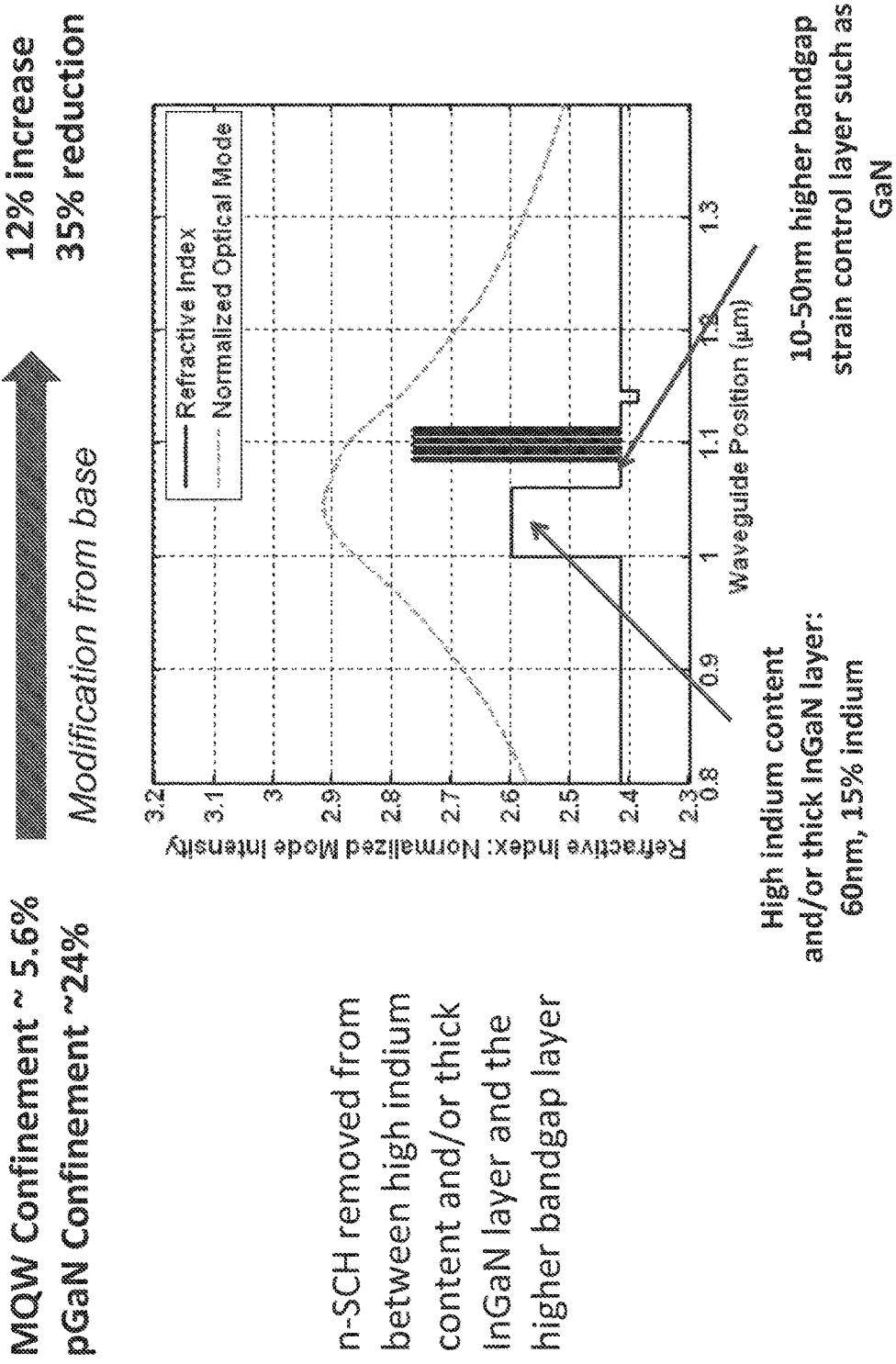
Figure 20: Example variant 4-both right way

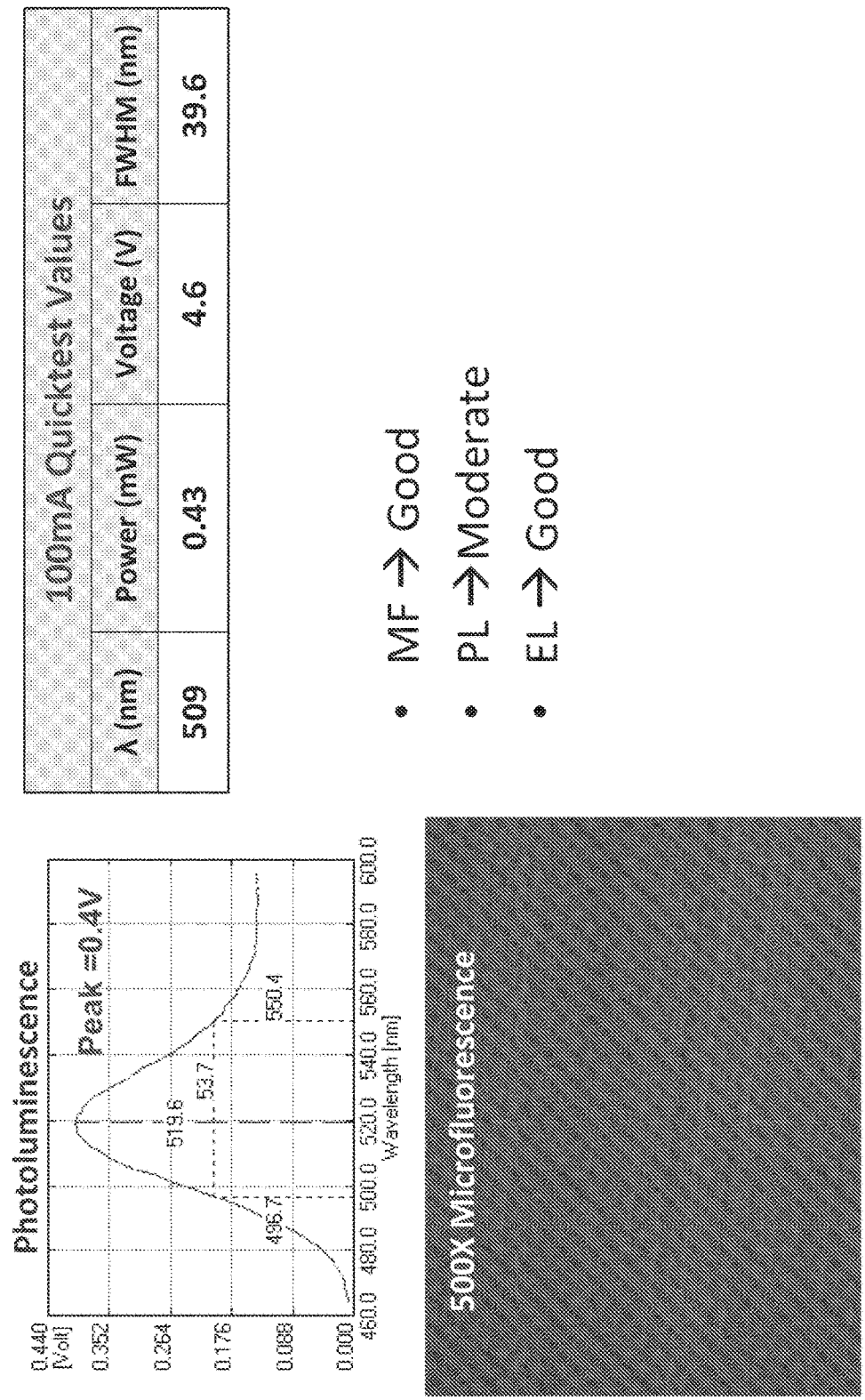
Figure 21: Growth data from example variant 4

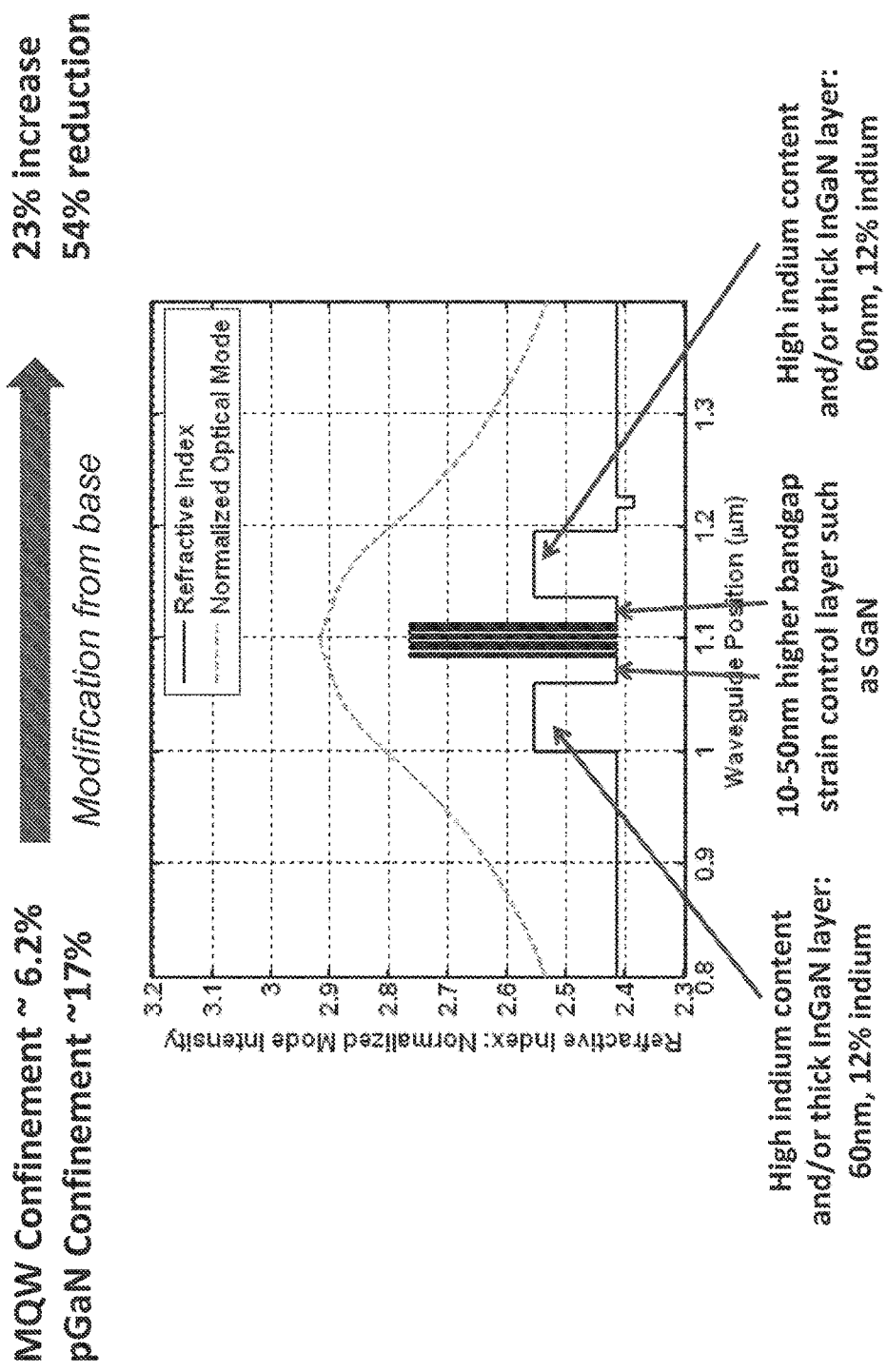
Figure 22a: Example variant with concept above and below active region

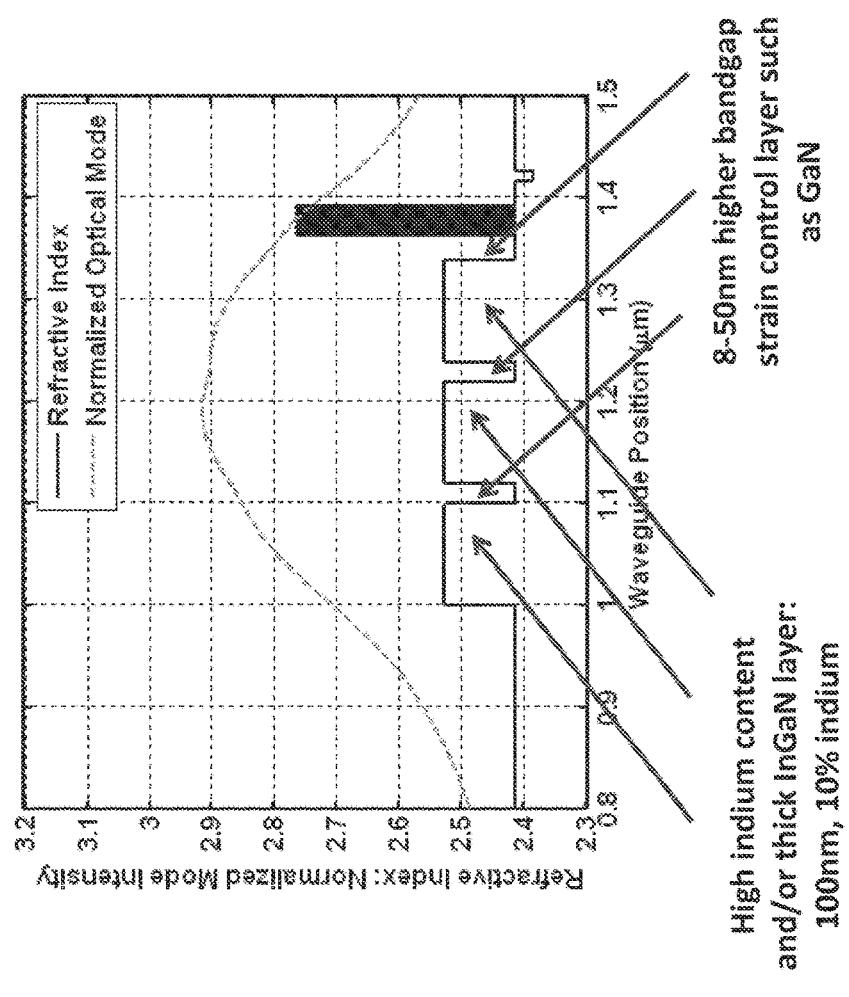
Figure 22b: Example variant with multiple high indium content and/or thick InGaN

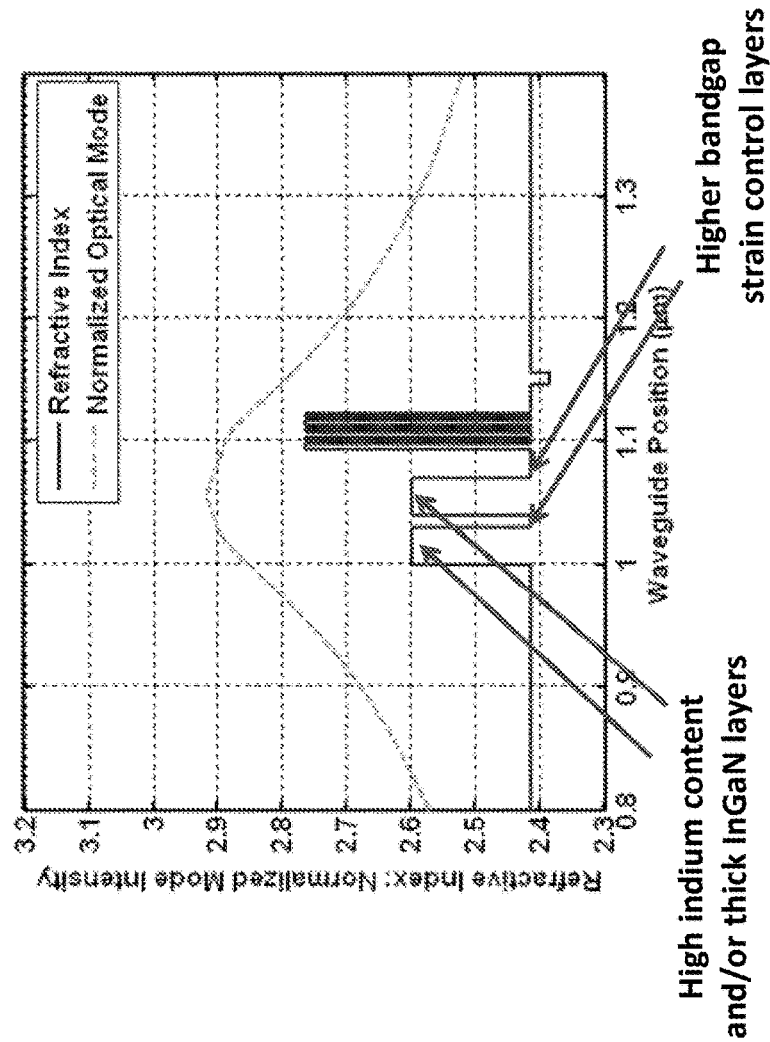
Figure 22C: Example variant with intermediate Strain control region

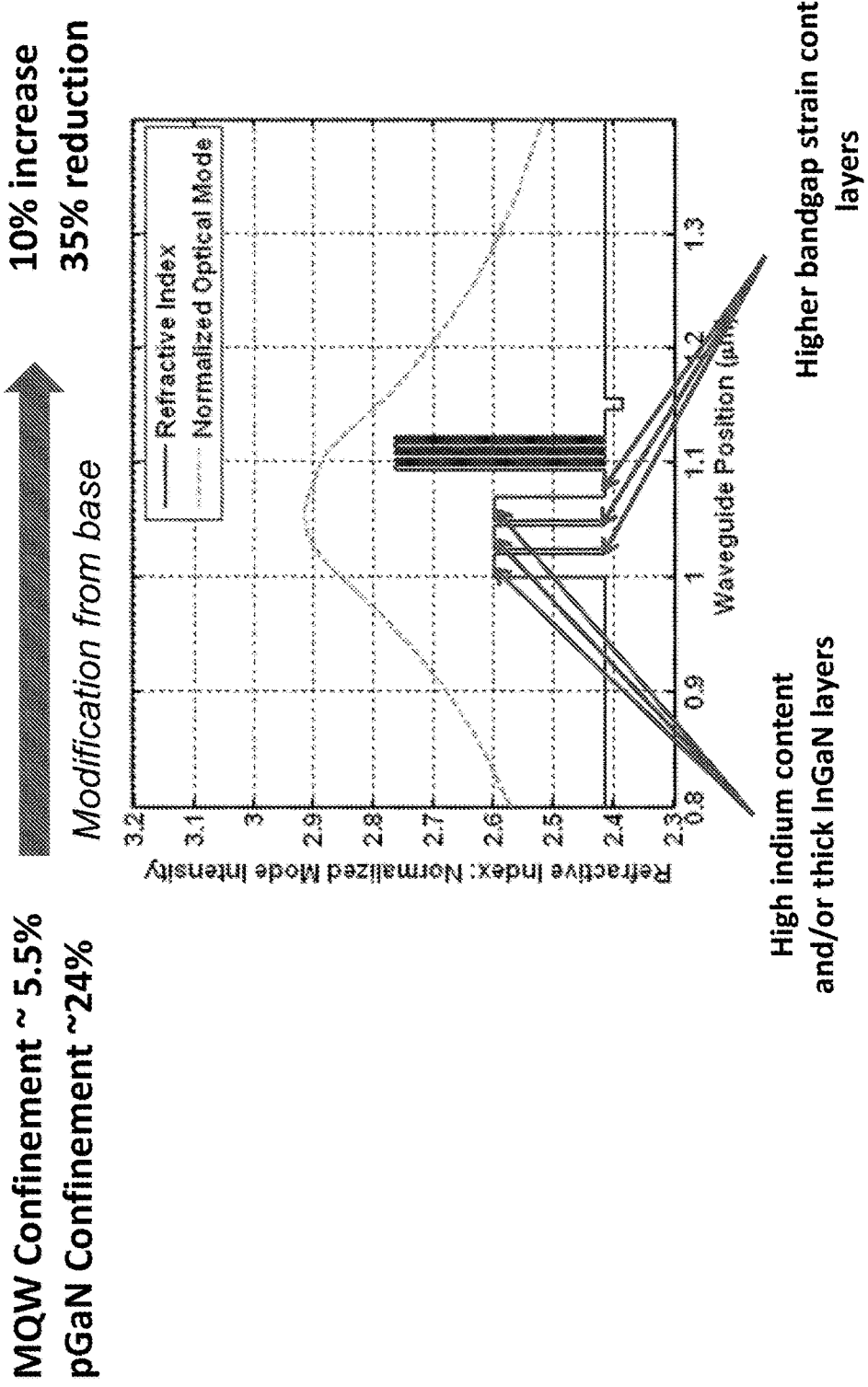
Figure 22D: Example variant with intermediate strain control regions

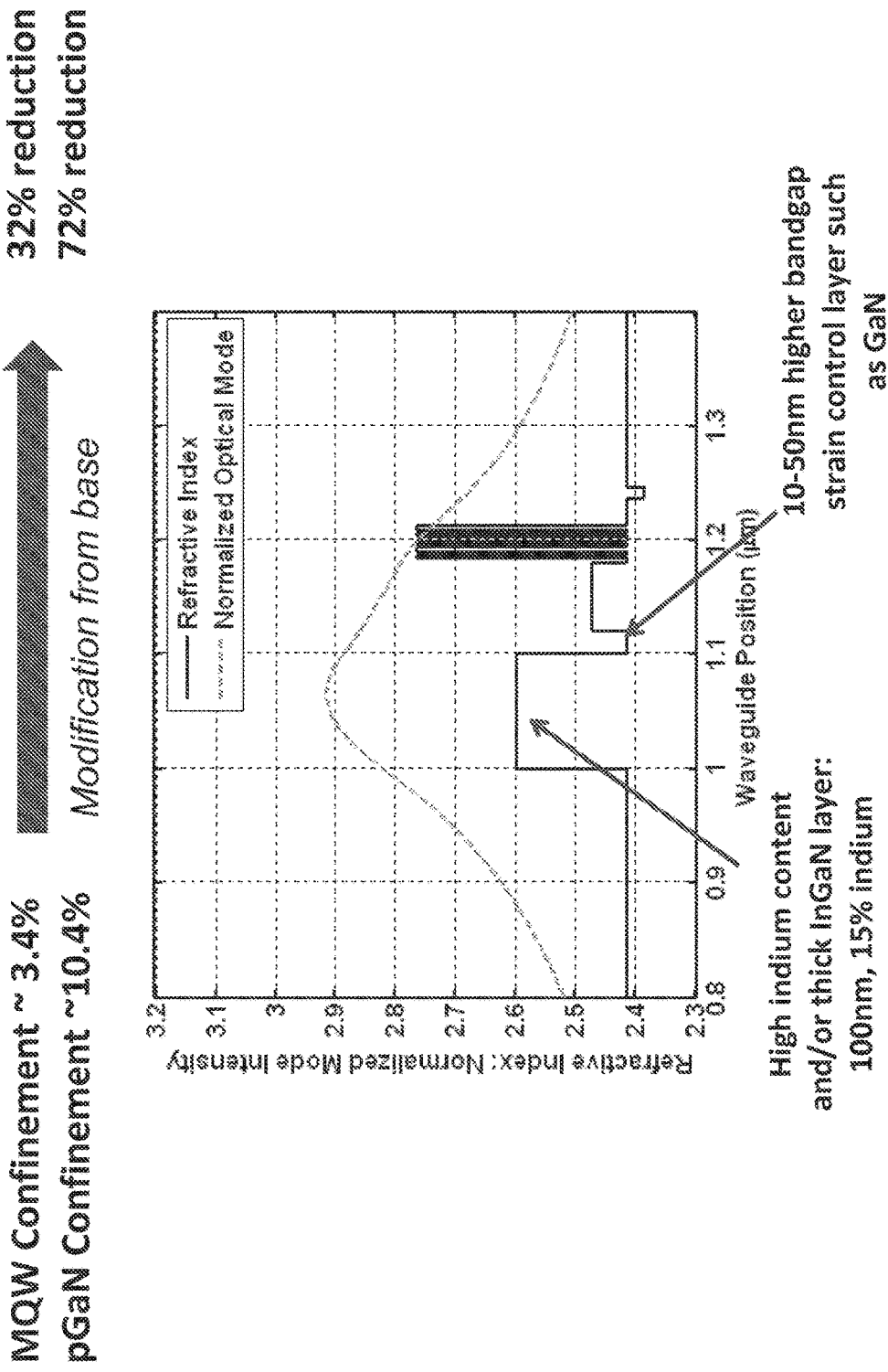
Figure 23: Example -Exceed strain budget

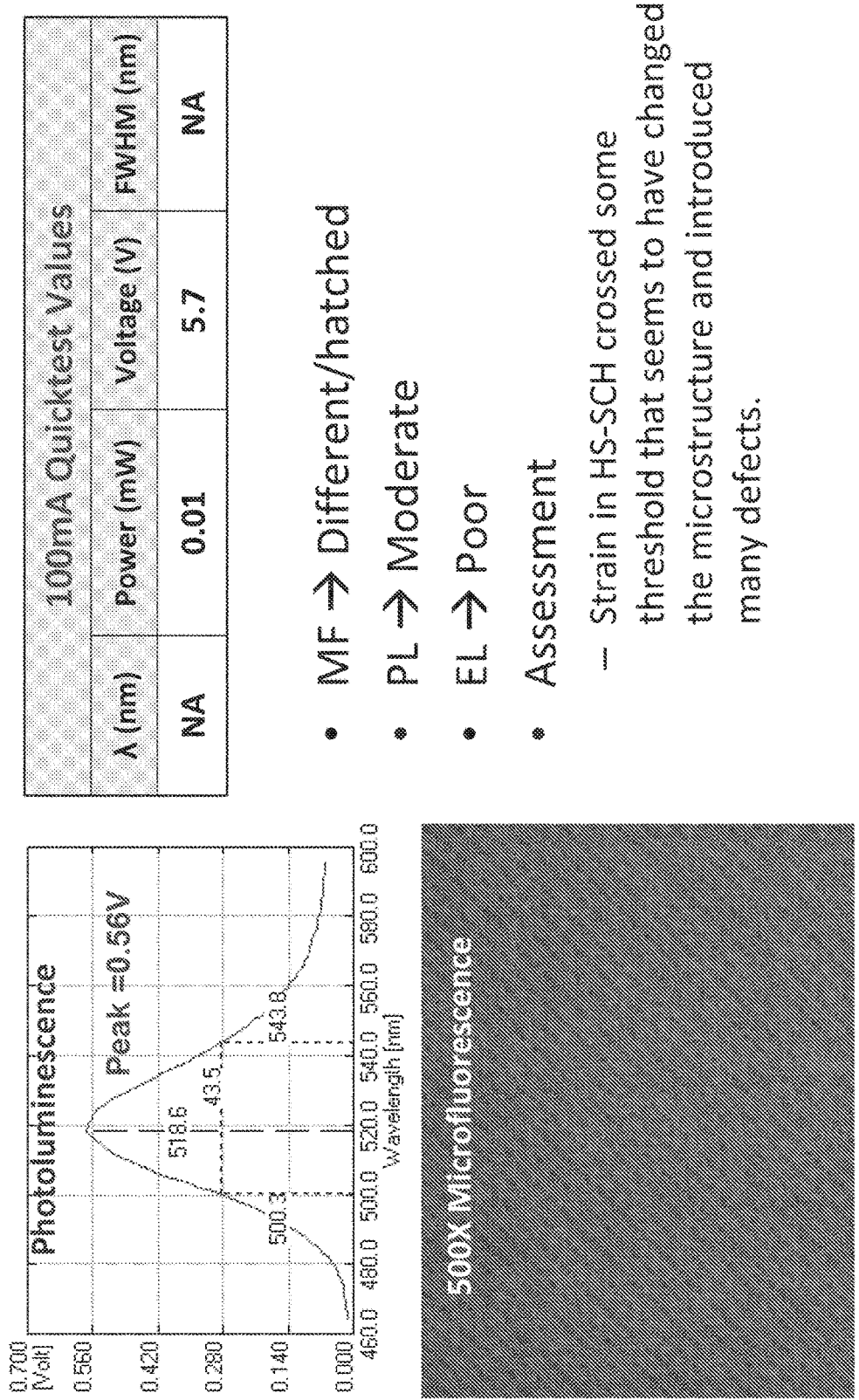
Figure 24: Exceed Strain Budget growth results

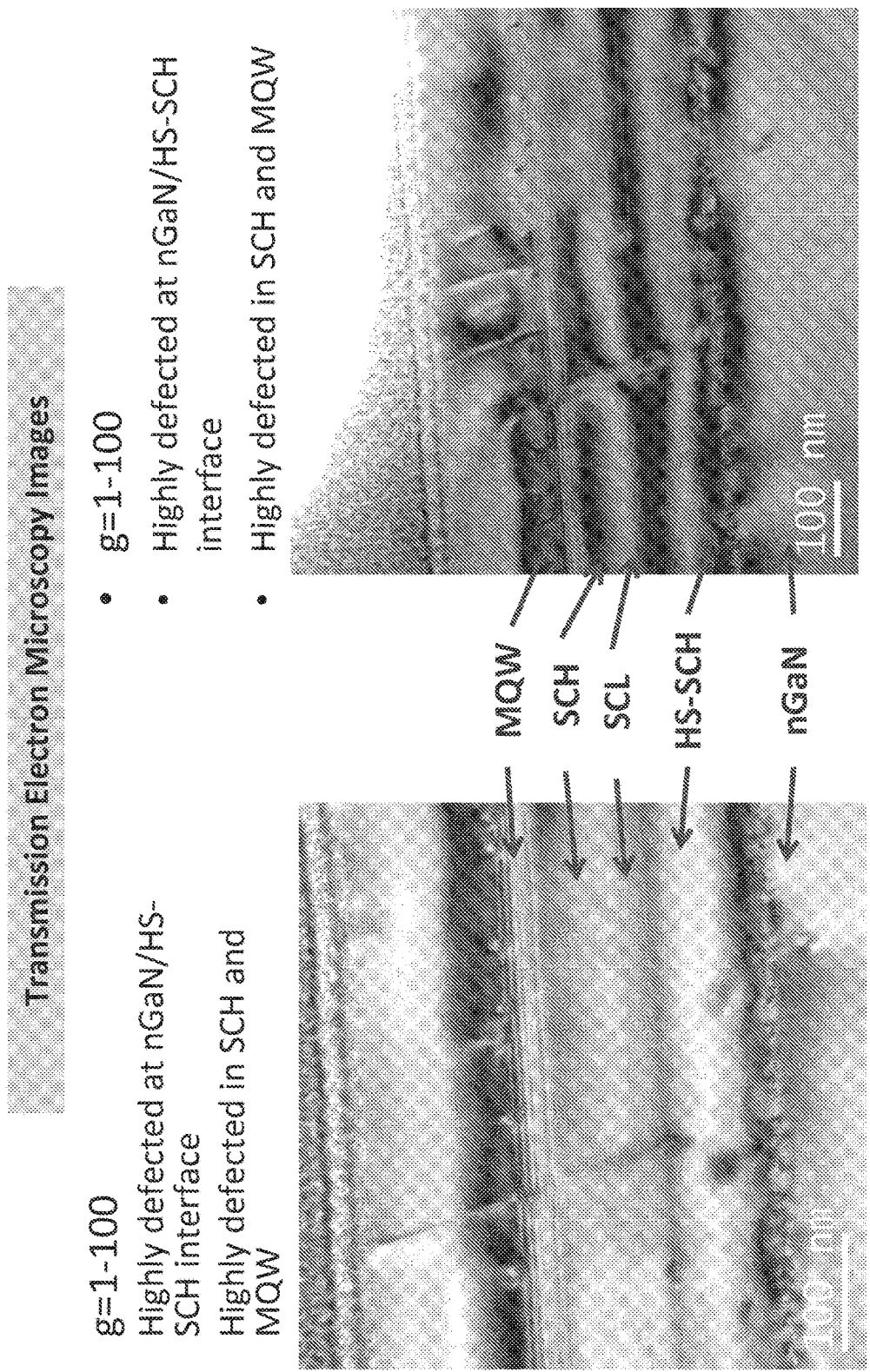
Figure 25: Exceed Strain Budget TEM

METHOD OF STRAIN ENGINEERING AND RELATED OPTICAL DEVICE USING A GALLIUM AND NITROGEN CONTAINING ACTIVE REGION

CROSS REFERENCE TO RELATED APPLICATION

The present application is a continuation of U.S. application Ser. No. 15/177,956, filed Jun. 9, 2016, which is a divisional of U.S. application Ser. No. 14/444,687, filed Jul. 28, 2014, which is a continuation of U.S. application Ser. No. 13/288,268, filed Nov. 3, 2011, which claims priority to U.S. Provisional Application No. 61/410,794, filed Nov. 5, 2010, each of which are incorporated herein by reference in their entirety for all purposes.

BACKGROUND OF THE INVENTION

The invention is directed to optical devices and related methods. In particular, the invention provides a method and device for emitting electromagnetic radiation using nonpolar or semipolar gallium containing substrates such as GaN, AlN, InN, InGaN, AlGaN, and AlInGaN, and others. The invention provides a method and device using a gallium and nitrogen containing substrate configured on the {20-21} family of planes or an off-cut of the {20-21} family of planes towards the plus or minus c-plane and/or towards the a-plane according to one or more embodiments, but there can be other configurations. Still more particularly, the invention provides a method and resulting structures that use high indium content InGaN or thick InGaN regions to facilitate manipulation of optical modes for desired optical properties in devices such as laser diodes. Such high indium content InGaN or thick InGaN regions are integrally coupled to a strain control region, which allows for such integration in an efficient and reliable manner. The invention can be applied to optical devices, lasers, light emitting diodes, solar cells, photoelectrochemical water splitting and hydrogen generation, photodetectors, integrated circuits, and transistors, among other devices.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high-end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

BRIEF SUMMARY OF THE INVENTION

The invention provides a method and device for emitting electromagnetic radiation using nonpolar or semipolar gallium containing substrates such as GaN, AlN, InN, InGaN, AlGaN, and AlInGaN, and others. More particularly, the invention provides a method and device using a gallium and nitrogen containing {20-21} substrate or off cut of the {20-21} plane towards the plus or minus c-plane and/or towards the a-plane according to one or more embodiments, but there can be other configurations such as a device using a gallium and nitrogen containing {30-31} substrate or off cut of the {30-31} plane, or the {10-11} or {11-22} family of planes. As used herein, the term "off-cut" or "mis-cut" may be used interchangeably. Still more particularly, the invention provides a method and resulting structures that use high indium content InGaN or thick InGaN regions to facilitate manipulation of optical modes for desired optical properties in devices such as laser diodes. Such high indium content InGaN or thick InGaN regions are integrally coupled to a strain control region, which allows for such integration in an efficient and reliable manner.

In general, laser devices made using gallium and nitrogen containing materials include a gallium and nitrogen containing substrate, active region, and electrode regions. In a preferred embodiment, an inclusion of a strain control region enables the incorporation of high indium content and/or thick layers of InGaN or other layers such as low Al content InAlGaN layers within the epitaxial structure without degradation of device characteristics, including photoluminescence, electroluminescence, and/or microfluorescence of the multi-quantum well regions. Without inclusion of the strain control region, the cumulative strain becomes too great such that the epitaxial structure becomes heavily defected with dislocations and other lattice imperfections. These defects degrade the material characteristics for use in optical devices, and they may exist at the interface between the high indium content and/or thick InGaN layer(s) and the underlying layer, and/or in the multi-quantum well active region, and/or in other regions.

Device characteristics for a laser device include a high indium content and/or thick indium containing layer, such as InGaN, and strain control region are substantially similar to or better than the characteristics of the laser diode without the high indium content and/or very thick layers of InGaN. Without the strain control region, the interface between the high indium content and/or thick layers of InGaN and the underlying layer becomes heavily defected and the multi-quantum well regions are significantly degraded with defects. Further, as shown in the growth data and TEM images below, if the high indium content and/or thick InGaN layer exceeds some threshold value of strain, the multi-quantum well regions are plagued with defects.

The invention provides a strain control region, which facilitates integration of a high indium content region and/or thick InGaN region that leads to improved laser diode characteristics. Such characteristics include confinement characteristics of optical modes, photoluminescence, electroluminescence, and others, alone or in combination. In such embodiments, the strain control region enables integration of such high indium content region and/or thick InGaN region without introduction of substantial defects to the multi-quantum well region or the region between the high indium content region and/or thick InGaN region and/or the multi-quantum well regions.

As further background, it is believed that high indium content and/or thick InGaN regions facilitate change and/or manipulation of an optical field and/or modes. As an example, the quantum well regions often have a higher index of refraction than the lower index of refraction cladding regions formed from materials such as GaN. In general, as governed by solutions to the Helmholtz (wave) equation, the optical field or mode in a laser waveguide structure becomes confined or pulled into regions of higher index such as the quantum well regions. By way of additional indium content to the InGaN regions, the index of the InGaN regions is increased. Such high indium content and/or thick InGaN regions can facilitate confinement of the optical mode within the vicinity of the quantum well region and can cause the optical mode to be pulled away (or downward) from the overlying p-type cladding regions. Confining the optical mode within the vicinity of the quantum well region for higher total confinement in the quantum wells and reducing the confinement in p-type layers leads to desirable laser device characteristics.

The invention provides a laser diode with a gallium and nitrogen containing substrate having a surface region and a high indium content or thick layer of InGaN or low Al content InAlGaN region overlying the surface region. The device has a strain control region, which is configured to maintain at least a quantum well region within a predetermined strain and/or defect state. Optionally, the device has an optical confinement region comprised of InGaN overlying the strain control region and a plurality of quantum well regions overlying the optical confinement region. In other embodiments, the device includes an additional optical confinement layer comprised of InGaN, or low Al content InAlGaN, overlying and above the quantum well region. In the preferred embodiment, however, the high indium content and/or thick layer of InGaN acts as an SCH region without the conventional SCH region and acts as a "Super SCH" region(s) or layer(s), which facilitate optical confinement of optical mode(s), and provides other features. In other embodiments, the Super SCH may be combined with other SCH regions, among other features.

In a preferred embodiment, the gallium and nitrogen containing substrate has a surface region oriented in a semi-polar or non-polar configuration. As an example, the surface region is configured in a {20-21} orientation. In alternative embodiments, the surface region may be configured in {30-31)}, {10-11}, or {11-22} orientations. Depending upon the embodiment, the surface region is configured to be in an off-set of a {20-21} orientation.

The device also has a plurality of quantum well regions overlying the strain control region. In a more preferred embodiment, the predetermined strain state also includes an interface region from high indium content and/or thick InGaN region to the underlying growth structure regions or substrates, among others.

The invention provides a method for fabricating an optical device within a strain budget. The method includes providing a gallium and nitrogen containing substrate having a surface region. The method includes determining an upper strain budget by cumulating strain information from at least a plurality of quantum well regions, optical confinement layers, and the high indium content and/or thick InGaN layers and integrating the plurality of quantum well regions, optical confinement layers, and the high indium content and/or thick InGaN layers with a strain control region to cause the upper strain budget to be within a predetermined strain budget. Preferably, the predetermined strain budget is less than the upper strain budget.

The device also has a strain budget of Q characterizing a cumulative strain characteristic associated with at least the plurality of quantum well regions and the strained region or more preferably an entire growth structure including the quantum well regions. The cumulative strain characteristic excludes a contribution from the strain control region. The strain budget Q is greater than the predetermined strain state. In an example, once the stain budget is exceeded, the epitaxial structure is subjected to an undesirable level of defects, which may be present at an interface region between the high indium content and/or thick InGaN layer and the underlying layer, or in the MQW region, or other regions. In other embodiments, the defects may be distributed, localized, patterned, or random throughout one or more of the growth regions, such as a gallium and nitrogen containing growth region.

Preferably, the defect threshold is above the upper level of defects within the plurality of quantum well regions without the strain adjustment region. In a preferred embodiment, the strained region is a high indium content and/or thick InGaN region, also called the Super SCH region and may be used for optical confinement. The present strain adjustment region has a suitable thickness, indium content, and is sometimes referred to as a strain control region.

Preferably, the defect state is fewer than a threshold number of defects capable of causing a photoluminescence characteristic and a electroluminescence characteristic to be below respective threshold levels. The device also has an optional optical confinement region overlying the strain control region and a plurality of quantum well regions overlying the optical confinement region. In a preferred embodiment, the strained region is a high indium content and/or thick InGaN region, also called the Super SCH region and may be used for optical confinement.

In an alternative embodiment, the invention provides an optical device comprising a gallium and nitrogen containing substrate and an overlying strain compensation region configured with a higher band gap material, which has a band gap higher than a lower band gap material within a vicinity of the higher band gap material. As an example, the lower band gap material includes both the high indium and/or thick InGaN regions and the quantum well regions. In a specific embodiment, the higher bandgap material is comprised of GaN, AlGaN, or InAlGaN.

In a preferred embodiment, the gallium and nitrogen containing material can be a high indium content and/or thick InGaN containing material, which manipulates optical confinement of optical mode(s) within a quantum well region, p-type layer regions, and/or other regions within the epitaxial structure.

Moreover, the invention provides a method for designing an optical laser diode device with desired confinement characteristics of the optical mode, the method comprising selecting a strain control region configured with a dopant level, a thickness, and a position relative to a multi-quantum well region; and integrating the strain control region with a high indium content and/or thick InGaN material to provide a desired confinement of the optical mode within the p-type cladding region and within the multi-quantum well region. In a preferred embodiment, the strain control region integrated with the high indium content material or thick InGaN material facilitates fewer defects or a desired level of defects within a structure of the laser diode device, while eliminating such strain control region leads to a higher density of defects and reduced performance levels in the optical device.

Still further, the invention provides an optical device, e.g., laser diode. The device includes a gallium and nitrogen containing substrate comprising a surface region. The substrate is characterized by a first lattice constant and a strained region overlying the surface region. The strain region is characterized by a second lattice constant. Preferably, the device has a strain control region formed overlying the strained region. Preferably, the strain control region characterized by a third lattice constant, which is substantially equivalent to the second lattice constant. In a specific embodiment, the strain control region is configured to maintain a quantum well region within a predetermined strain state and/or to maintain a cumulative strain within an entirety of a growth structure of the optical device within a predetermined and/or desirable strain state, which has fewer defects for improved optical performance. Optionally, the device includes an additional optical confinement region overlying the strain control region and a plurality of quantum well regions overlying the optical confinement region. In a preferred embodiment, the strained region comprises a high indium and/or thick InGaN material or materials, which also act as an optical confinement region.

The device also has a gallium and nitrogen containing material comprising InGaN overlying the surface region. The device has a strain control region, the strain control region being configured to maintain a cumulative strain within an entirety of a growth region including a quantum well region within a predetermined strain state. The device also has a plurality of quantum well regions overlying the strain control region. In a preferred embodiment, the plurality of quantum well regions are configured to emit electromagnetic radiation characterized by an optical mode spatially disposed at least partially within the quantum well region. In a preferred embodiment, the gallium and nitrogen containing material is configured with a thickness and an indium content to manipulate a confinement of the optical mode and configured to absorb a stray and/or leakage of the emission of electromagnetic radiation.

The gallium and nitrogen containing material can be configured to absorb a stray and/or leakage of the emission of electromagnetic radiation without any ability to manipulate confined optical mode as governed by the wave equation. In such embodiment, the material will be spatially disposed away from the optical mode and is configured for absorption of the stay or undesirable emissions, and the like. In a preferred embodiment, the material has a thickness of 5 nm to about 50 nm and an indium content of 14% to 25%, or alternatively, a thickness of 50 nm to 200 nm with indium content of 5% to 15%, as well as other variations. In a preferred embodiment, the gallium and nitrogen containing material configured as the absorber is at least 0.5 microns below the multi-quantum well or other ranges such as 0.5 to 1.5 microns below, or 1.5 to 3 microns below, or 3 to 10 microns below the multi-quantum well, or a spatial distance sufficient to absorb stray or leakage radiation without influencing the optical mode in the multi-quantum well. In other embodiments, the absorbing material can be integrated, buried, or disposed within a vicinity of the n-type cladding region.

Still further, the invention provides an optical device, e.g., laser diode. The device includes a gallium and nitrogen containing substrate comprising a surface region, which may be oriented in either a semipolar or non-polar configuration. The device also has a first gallium and nitrogen containing material comprising InGaN overlying the surface region and a first strain control region overlying the first gallium and nitrogen containing material. The device has a second gallium and nitrogen containing material comprising InGaN overlying the surface region and a second strain control region overlying the first gallium and nitrogen containing material. In a specific embodiment, the device has a plurality of quantum well regions overlying the strain control region. In a preferred embodiment, the first strain control region is characterized by a higher band gap material than both the first gallium and nitrogen containing material and the quantum well regions and the second strain control region is characterized by a higher band gap material than both the second gallium and nitrogen containing material and the quantum well regions. Optionally, multiple intermediary strain control regions integrally coupled to a plurality of high indium and/or thick InGaN are included, as further described in the following specification.

Moreover, the invention includes an optical device. The device includes a gallium and nitrogen containing substrate comprising a surface region and a first lattice constant and a strained region overlying the surface region. Preferably, the strained region has a second lattice constant, which is larger than the first lattice constant. The device also has a strain control region having a third lattice constant, which is substantially equivalent to the second lattice constant. The strain control region is configured to maintain at least a quantum well region within a predetermined strain state. The device has an optical confinement region overlying the strain control region and a plurality of quantum well regions overlying the optical confinement region. Each of the plurality of quantum well regions has a fourth lattice constant, which is substantially equivalent to the second lattice constant. Preferably, the strain control region has a higher bandgap than the strained region and the quantum well layers. In a preferred embodiment, each of the lattice constants is parallel to a projection of a c-direction. Additionally, the gallium and nitrogen containing substrate is configured on a semi-polar plane, such as (20-21) according to a specific embodiment.

As used herein in examples, the terms "high indium content and/or thick InGaN layer(s) or regions" generally refers to an InGaN or like material capable of manipulating an optical mode or modes within a design of a laser diode. As an example, such InGaN region or layers are characterized by a thickness range and an indium concentration range that leads to excessive cumulative strain within the growth structures and hence certain material degradation such as defects in the growth structures without the present strain control region(s) or layer(s). That is, if there were no strain control region, such InGaN layers would be detrimentally strained and lead to poor or undesirable material characteristics such as photoluminescence, electroluminescence, and optical device efficiency due certain defect characteristic in the structure that would be present at the interface between the high indium content and/or thick InGaN region and the underlying layer, and/or in the multi-quantum well region, and/or in other regions. It should be noted that the InGaN layer(s) in its final form may be partially relaxed due to the presence of defects and/or the strain control region, although it would be strained without such defects and/or stain control region. As an example, such cumulative strain often is a function of a combination of indium concentration and total thickness. For lower indium content layers, much thicker layers are grown before cumulative strain degradation occurs, while higher indium content may result in thinner layers before cumulative strain degradation occurs. Also, a higher number of quantum wells may lead to higher cumulative stain than fewer quantum wells.

In a specific embodiment, the present InGaN region can be configured with a suitable thickness and indium content for a laser diode device. Such InGaN region includes a thickness range from about 30 to about 80 nm and about 11 to about 16% indium content. Alternatively, the InGaN region includes a thickness range from about 70 to about 150 nm and about 8 to about 13% indium content. Alternatively, the InGaN region includes a thickness ranging from about 140 to about 300 nm and about 5 to about 9% indium content. Alternatively, the InGaN region includes a thickness ranging from about 250 to about 500 nm and about 3 to about 6% indium content. Alternatively, the InGaN region includes a thickness ranging from about 10 nm to about 30 nm and about 15 to about 22% indium content. Other variations can also exist depending upon the specific embodiment.

As used herein as an example, an SCH or optical confinement regions includes an InGaN or other indium containing layer(s) that yield acceptable defect levels and material quality when incorporated in a device structure containing a multiple quantum well active region on nonpolar or semi-polar Ga containing substrates such as {20-21}. Examples of SCH regions are InGaN layers with a thickness range from about 30 to about 80 nm and about 5 to about 8% indium content, or a thickness range from about 70 to about 150 nm and about 3 to about 6% indium content, or a thickness ranging from about 140 to about 300 nm and about 2 to about 4% indium content, or a thickness ranging from about 250 to about 500 nm and about 1 to about 3% indium content.

As used herein the term Super SCH includes an InGaN or other indium containing layer(s) that yield heavily defected material and hence poor device properties due to excessive strain when incorporated in a device structure and not combined with strain control region(s) on nonpolar or semipolar Ga containing substrates such as {20-21}. Once the Super SCH has been integrated with the strain control region(s) acceptable, desirable, and even improved device performance occurs, as will be described throughout the present specification and more particularly below. Examples of such Super SCH regions are InGaN layers with a thickness range from about 30 to about 80 nm and about 11 to about 16% indium content, or a thickness range from about 70 to about 150 nm and about 8 to about 13% indium content, or a thickness ranging from about 140 to about 300 nm and about 5 to about 9% indium content, or a thickness ranging from about 250 to about 500 nm and about 3 to about 6% indium content, or a thickness ranging from about 10 nm to about 30 nm and about 15 to about 22% indium content.

Additional benefits are achieved over pre-existing techniques using the invention. In particular, the invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar gallium nitride material capable of achieve a green laser device, among others. In one or more embodiments, the laser device is capable of emitting long wavelengths such as those ranging from about 480 nm to greater than about 540 nm, but can be others such as 540 nm to 660 nm. In one or more alternative embodiments, the laser device is capable of emitting long wavelengths such as those ranging from about 430 nm to greater than about 480 nm, but can be others. In a preferred embodiment, the present method and structure can be used to control or engineer strain within the wave guiding layers and quantum well region of laser devices. The present method and structure uses a semi-polar oriented substrate and growth structures that are capable of a change in lattice structure to be larger and incorporate additional indium, which leads to improved optical and electrical performance. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

FIG. 1 is a diagram of a laser diode on a {20-21} gallium and nitrogen containing substrate having cleaved facets;

FIG. 2B is a cross-sectional view diagram of a laser diode;

FIG. 3 is an example of the refractive index and optical mode profile for a green laser diode without a strain control region;

FIG. 4 is an example of growth characteristics of the laser diode of FIG. 3;

FIG. 5 is an illustration of microfluorescence defect density for multiple laser diode structures;

FIG. 6 is a flow diagram of a method of tuning an active region for a desired strain characteristic;

FIG. 7 is an illustration of a method of providing waveguide characteristics for laser diode devices according to embodiments of the invention.

FIG. 8 is an illustration of photoluminescence peak intensity for multiple laser diode structures;

FIG. 9 is an illustration of electroluminescence power for multiple laser diode structures;

FIG. 10 is an example of the refractive index and optical mode profile for a green laser diode;

FIG. 11 is an example of growth characteristics for the laser diode of FIG. 10;

FIG. 12 is a transmission electron microscope image for the laser diode of FIG. 10;

FIG. 13 illustrates micro-fluorescence of laser devices without strain control regions;

FIG. 14 is an example of growth characteristics for a laser diode of FIG. 13;

FIGS. 15A and 15B are transmission electron microscope images of cross-sections of laser diodes without strain control regions;

FIG. 16 is an example of the refractive index and optical mode profile for a green laser diode;

FIG. 17 is an example of growth characteristics for the laser diode of FIG. 16;

FIG. 18 is a simplified example of an active region of a laser diode;

FIG. 19 is a simplified example of growth characteristics for the laser diode of FIG. 18;

FIG. 20 is a simplified example of the refractive index and optical mode profile for a green laser diode;

FIG. 21 is a simplified example of growth characteristics for the laser diode of FIG. 18;

FIG. 22A is an example of the refractive index and optical mode profile of a high indium content InGaN region above and below the MQW of a green laser diode;

FIG. 22B is an example of the refractive index and optical mode profile for a daisy chain of high indium content and strain control regions configured to modify the lattice constant within an active region of a green laser diode;

FIG. 22C is an example of the refractive index and optical mode profile of an intermediate strain control region within a high indium content and/or thick InGaN regions of a green laser diode;

FIG. 22D is an example of the refractive index and optical mode profile of an intermediate strain control region within a high indium content and/or thick InGaN regions of a green laser diode;

FIG. 23 is an example of the refractive index and optical mode profile of a green laser diode having a strain control region exceeding a strain budget;

FIG. 24 is an example of growth characteristics for a laser diode of FIG. 23;

FIG. 25 shows transmission electron microscope images of the laser diode of FIG. 23.

DETAILED DESCRIPTION OF THE INVENTION

Figure 2A:
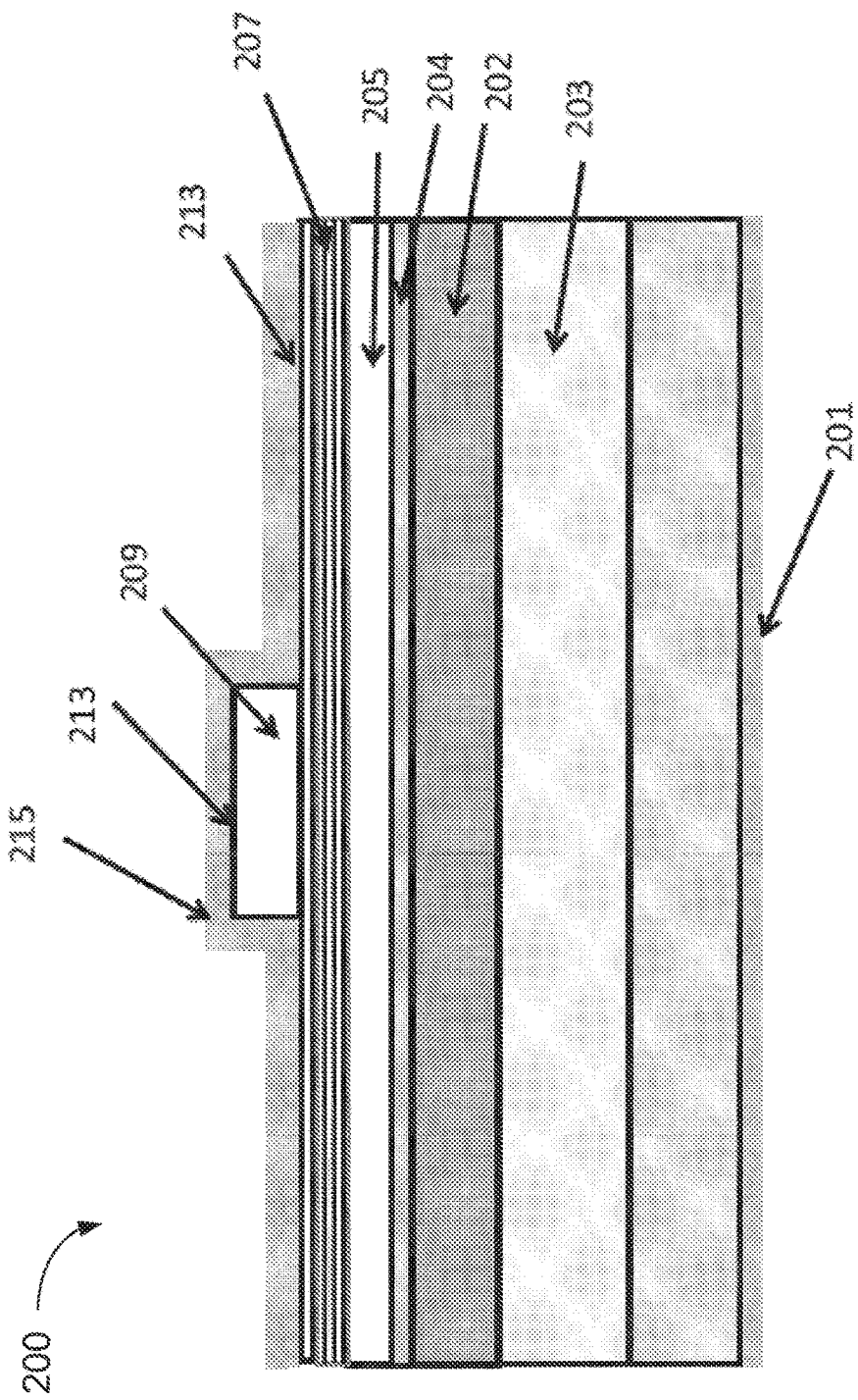
FIG. 2A is a simplified cross-sectional view diagram of a laser diode.

We have discovered a way to design and fabricate high intensity green laser diode devices in a specific embodiment. In a specific embodiment, the present method and structure includes a high indium content and/or thick InGaN layers in the present epitaxial structures grown on {20-21} and offcuts thereof in gallium and nitrogen containing substrates. In a preferred embodiment, the high indium content and/or thick InGaN layers include 200-300 nm InGaN layers with 6% indium, 100 nm InGaN layers with 10% indium, 60 nm InGaN layers with 13-15% indium, or 30 nm InGaN layers with 15-18% indium within the present green laser diode epitaxial structure without detriment to photoluminescence properties, electroluminescence properties, or defect density of the light emitting multiple quantum well active region. In a specific embodiment, the present green laser diode epitaxial structure includes an n-type GaN cladding region(s), an n-side separate confinement hetereostructure (SCH), a multiple quantum well active region (MQW), a p-side SCH or GaN guiding layer, and electron blocking layer, and a p-type GaN cladding region. However, with the inclusion of the high indium content and/or thick InGaN layer, not all of these layers would be provided in a preferred epitaxial structure. For example, the n-side SCH layer can be removed such that the high indium content and/or thick InGaN layer would be used to modify the optical confinement properties of the mode and hence would act as an SCH region without the SCH region and therefore a "Super-SCH" region. In other embodiments, the combination of an SCH and high indium content and/or thick InGaN layers are included.

In a preferred embodiment, the method and structure includes use of a combination of the high indium content and/or thick InGaN layers with a strain control region. As an example in such embodiments, in order to include these high indium content and/or thick InGaN layers that act as the "super-SCH", one preferably includes the strain control region. That is, the strain control region exists spatially between the high indium content and/or thick InGaN layers and the MQW. The strain control region performs some sort of strain compensation function and ultimately suppresses the defect density at the interface between the high indium content and/or thick InGaN layer and the underlying layer(s), in the multiple quantum well region, or in other regions, as will be further explained and described below. It also limits the defect density within the MQW in a specific embodiment. The strain control region is generally composed of a material with higher bandgap than both the high indium content and/or thick InGaN layer and the quantum well layers. The strain control region is preferably 5 nm to 20 nm or 20 nm to 50 nm and comprised of GaN, AlGaN, or InAlGaN and can be doped.

As an example, the present method and structures lead to improved optical device performance, as describe below. In a specific embodiment, the present method and structure includes a high indium content and/or thick InGaN region within an optical device.

As an example by including the high indium content and/or thick InGaN layer in the waveguide design as the Super SCH, the optical mode can be asymmetrically shaped such that it is skewed away from the p-type regions to reduce optical confinement in the p-type regions. Since the p-type regions are absorbing to the optical field, by skewing the optical mode away from the p-type regions the modal loss in the laser cavity will be reduced. This will enable higher slope efficiency and reduced threshold current in a laser diode for an overall increased wall plug efficiency. As an example, embodiments are shown in at least FIGS. 10 and 16. Also as an example, the Super SCH and strain control regions are spatially positioned below the present n-side SCH and MQW. In these embodiments, the optical mode is pulled downward toward the n-type cladding. However, in this embodiment the optical confinement in the MQW is also reduced, which will reduce the gain of the laser diode.

By including high indium content InGaN layer(s) below or below and above the multiple quantum well active region in close vicinity, the optical mode in the laser active region is preferably concentrated around and/or within the multiple quantum wells or slight variations in spatial regions within and around the multiple quantum wells. That is, the optical mode is pulled inward toward the MQW and high-indium content and thus the field intensity will be stronger around the MQW. This will increase the optical confinement in the MQW and hence increase the modal gain, which is desirable. Since the threshold current density is dictated by the modal gain and the losses, an increased gain will allow for lower threshold current densities. Further, by pulling the mode inward toward the MQW and high indium content InGaN layer, the optical confinement in the p-type regions can be reduced for reduced modal losses. Example embodiments with high indium content Super SCH layers below the MQW are given in at least FIGS. 18 and 20. An example embodiment of the Super SCH layers positioned above and below the MQW is given in at least FIG. 22a.

By growing high indium content and/or thick InGaN layers that partially relax by misfit dislocations at a lower interface region between the substrate and overlying growth regions, the native lattice constant of the epitaxial stack is modified as it becomes identical to InGaN with some or a certain indium content. By coherently depositing the higher bandgap strain control region on top of the high indium content and/or thick InGaN layer, the strain control layer takes on the new native lattice constant, which as stated, is closer to InGaN with some indium concentration. Since this strain control region limits the defects and enables the growth of high quality light emitting MQW regions, this indicates that these high quality MQW regions are strained to a different lattice constant than the initial GaN lattice constant of the substrate. Since the new lattice constant is matched to InGaN with some concentration of indium, the MQW active region will be less strained. Because strain is a main degradation mechanism as more indium is added to the MQW to extend the emission wavelength, this is a desirable feature for extending the MQW emission wavelength to the yellow and red regimes, and possibly even to improve the efficiency in the green regime. By modifying the lattice constant to InGaN with some indium content with the partially relaxed high indium content and/or thick InGaN layers and then growing a strain control region to limit defects and maintain high quality MQW quality, increased emission efficiency can be achieved in the red, yellow, and green wavelength regimes on semipolar GaN.

In a specific embodiment, the invention provides an optical device, e.g., laser, LED. The device includes a gallium and nitrogen containing substrate (e.g., GaN) comprising a surface region oriented in either a semipolar or non-polar configuration, but can be others. The device also has a gallium and nitrogen containing material comprising InGaN overlying the surface region. The device has a strain control region, the strain control region being configured to maintain a cumulative strain within an entirety of a growth region including a quantum well region within a predetermined strain state. The device also has a plurality of quantum well regions overlying the strain control region. In a preferred embodiment, the plurality of quantum well regions are configured to emit electromagnetic radiation characterized by an optical mode spatially disposed at least partially within the quantum well region. In a preferred embodiment, the gallium and nitrogen containing material is configured with a thickness and an indium content to manipulate a confinement of the optical mode and configured to absorb a stray and/or leakage of the emission of electromagnetic radiation. In an alternative specific embodiment, the gallium and nitrogen containing material can be configured to absorb a stray and/or leakage of the emission of electromagnetic radiation without any ability to manipulate optical mode. In such embodiment, the material will be spatially disposed away from the optical mode and is configured for absorption of the stay or undesirable emissions, and the like. In a preferred embodiment, the material has a thickness of 5 nm to about 50 nm and an indium content of 14% to 25%, or alternatively, a thickness of 50 nm to 200 nm with indium content of 5% to 15%, as well as other variations. In a preferred embodiment, the gallium and nitrogen containing material configured as the absorber is at least 0.5 microns below the multi-quantum well or other ranges such as 0.5 to 1.5 microns below, or 1.5 to 3 microns below, or 3 to 10 microns below the multi-quantum well, or a spatial distance sufficient to absorb stray or leakage radiation without influencing the optical mode in the multi-quantum well. In other embodiments, the absorbing material can be integrated, buried, or disposed within a vicinity of the n-type cladding region.

In a specific embodiment, the present laser device can be employed in either a semipolar or non-polar gallium containing substrate, as described below. As used herein, the term "substrate" can mean the bulk substrate or can include overlying growth structures such as a gallium and nitrogen containing epitaxial region, or functional regions such as n-type GaN, combinations, and the like. We have also explored epitaxial growth and cleave properties on semipolar crystal planes oriented between the nonpolar m-plane and the polar c-plane. In particular, we have grown on the {30-31} and {20-21} families of crystal planes. We have achieved promising epitaxy structures and cleaves that will create a path to efficient laser diodes operating at wavelengths from about 400 nm to green, e.g., 500 nm to 540 nm. These results include bright blue epitaxy in the 450 nm range, bright green epitaxy in the 520 nm range, and smooth cleave planes orthogonal to the projection of the c-direction. It is desirable to align the laser cavities parallel to the projection of the c-direction for maximum gain on this family of crystal planes.

Although it was believed that a higher gain would be offered in the projection of the c-direction than would be available in the a-direction, it is also desirable to form a high quality cleavage plane orthogonal to a stripe oriented in the projection of the c-direction. More specifically, we desired a high quality cleavage plane orthogonal to the [10-1-7] for a laser stripe formed on the {20-21} plane. In one or more preferred embodiments, we determined a high quality cleave plane substantially orthogonal to the projection of the c-direction, [10-1-7]. In particular, we determined that if a top side skip-scribe scribing technique is used followed by a break step a high quality smooth and vertical cleaved facet would be formed on the upper portion of the cleave face according to one or more embodiments. Below the upper portion of the cleave face the facet becomes angled, which may not be optimum for a laser diode mirror according to one or more embodiments. In other embodiments, however, such angled cleave characteristic is desirable for laser fabrication since the laser mirror will be positioned on top of the substrate where the cleave face is vertical. In one or more embodiments, when the sample is back side laser scribed and then broken, an angled, but smooth cleave face is formed. Such a smooth cleave face may be desirable for lasers, but it is not the most preferable since the laser mirror will be tilted. The top-side skip scribe technique looks more preferably according to one or more embodiments.

FIG. 1 is a perspective view of a laser device 100 fabricated on an off-cut m-plane {20-21} substrate according to an embodiment of the invention. As shown, the optical device includes a gallium nitride substrate member 101 having the off-cut m-plane crystalline surface region. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about 10E5 cm-2 and about 10E7 cm-2 or below 10E5 cm-2. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about 10E5 cm-2 and about 10E8 cm-2, in a direction that is substantially orthogonal or oblique with respect to the surface. As a consequence of the orthogonal or oblique orientation of the dislocations, the surface dislocation density is between about 10E5 cm-2 and about 10E7 cm-2 or below about 10E5 cm-2. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, commonly assigned, and hereby incorporated by reference herein.

In a specific embodiment on the {20-21} GaN, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser strip region has a first end 107 and a second end 109. In a preferred embodiment, the device is formed on a projection of a c-direction on a {20-21} gallium and nitrogen containing substrate having a pair of cleaved mirror structures, which face each other. In a preferred embodiment, the first cleaved facet comprises a reflective coating and the second cleaved facet comprises no coating, an antireflective coating, or exposes gallium and nitrogen containing material.

In a preferred embodiment, the device has a first cleaved facet provided on the first end of the laser stripe region and a second cleaved facet provided on the second end of the laser stripe region. In one or more embodiments, the first cleaved facet is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

In a specific embodiment, the laser stripe has a length and width. The length ranges from about 50 microns to about 3000 microns, but is preferably between 400 microns and 1000 microns. The stripe also has a width ranging from about 0.5 microns to about 50 microns, but is preferably between 0.8 microns and 3 microns, but can be other dimensions. In a specific embodiment, the present device has a width ranging from about 0.5 microns to about 1.5 microns, a width ranging from about 1.5 microns to about 3.0 microns, and others. In a specific embodiment, the width is substantially constant in dimension, although there may be slight variations. The width and length are often formed using a masking and etching process, which are commonly used in the art.

In a specific embodiment, the invention provides an alternative device structure capable of emitting 501 nm and greater (e.g., 525 nm) light in a ridge laser embodiment. The device is provided with one or more of the following epitaxially grown elements, but is not limiting, and in reference to FIG. 2A.

an n-GaN cladding region with a thickness of 50 nm to about 6000 nm with a Si or oxygen doping level of about 5E16 cm-3 to 1E19 cm-3 an InGaN region of a high indium content and/or thick InGaN layer(s) or Super SCH region;

a higher bandgap strain control region overlying the InGaN region;

optionally, an SCH region overlying the InGaN region;

multiple quantum well active region layers comprised of three to five or four to six 3.0-5.5.0 nm InGaN quantum wells separated by 1.5-10.0 nm GaN barriers optionally, a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 400 nm to 1000 nm with Mg doping level of 5E17 cm-3 to 1E19 cm-3 a p++-GaN contact layer with a thickness from 20 nm to 40 nm with Mg doping level of 1E20 cm-3 to 1E21 cm-3

In a specific embodiment, the laser device is fabricated on a {20-21} substrate.

FIG. 2A is a cross-sectional view of a laser device 200 fabricated on a {20-21} substrate according to an embodiment of the invention. As shown, the laser device includes gallium nitride substrate 203, which has an underlying n-type metal back contact region 201. An n-type cladding region is formed overlying the gallium nitride substrate. Overlying the gallium nitride substrate and n-type cladding region is a high indium content and/or thick InGaN layer 202. In a specific embodiment, the device has a strain control layer 204 overlying the high indium content and/or thick InGaN layer. In a specific embodiment, the metal back contact region is made of a suitable material such as those noted below and others.

In a specific embodiment, the device also has an overlying n-type gallium nitride layer 205, an n-type cladding layer, a high indium content and/or thick InGaN layer 202, a strain control layer 204, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about 1E16 cm-3 and 1E20 cm-3.

In a specific embodiment, an n-type AluInvGa1-u-vN layer, where 0≤u, v, u+v≤1, is deposited on the substrate. In a specific embodiment, the carrier concentration may lie in the range between about 1E16 cm-3 and 1E20 cm-3. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 15000. A flow of disilane in a carrier gas, with a total flow rate of between about 0.1 and 10 sccm, is initiated.

In a specific embodiment, the high indium content and/or thick InGaN layer(s) or regions comprises an InGaN or like material capable of manipulating an optical mode or modes within a design of a laser diode. As an example, such InGaN region or layers are characterized by a thickness range and an indium concentration range that leads to excessive cumulative strain within the growth structures and hence certain material degradation in the growth structures without the present strain control region(s) or layer(s). That is, if there were no strain control region, such InGaN layers would be detrimentally strained and lead to poor or undesirable material characteristics such as photoluminescence, electroluminescence, and optical device efficiency resulting from certain defect characteristics in the structure that could be located in the multi-quantum well region, and/or at the interface between the high indium content and/or thick InGaN region and the underlying layer, and/or in other regions. As an example, such cumulative strain often is a function of a combination of indium concentration and total thickness. For lower indium content layers, much thicker layers are grown before cumulative strain degradation occurs, while higher indium content may result in thinner layers before cumulative strain degradation occurs. Also, a higher number of quantum wells may lead to higher cumulative stain than fewer quantum wells.

In a specific embodiment, the present InGaN region can be configured with a suitable thickness and indium content for a laser diode device. Such InGaN region includes a thickness range from about 30 to about 80 nm and about 11 to about 16% indium content. Alternatively, the InGaN region includes a thickness range from about 70 to about 150 nm and about 8 to about 12% indium content. Alternatively, the InGaN region includes a thickness ranging from about 140 to about 300 nm and about 5 to about 9% indium content. Alternatively, the InGaN region includes a thickness ranging from about 250 to about 500 nm and about 3 to about 6% indium content. Alternatively, the InGaN region includes a thickness ranging from about 10 nm to about 30 nm and about 15 to about 22% indium content.

In a specific embodiment, the strain control layer(s) or regions, which also serves as a compensation region, comprises a higher band gap material, which has a band gap higher than a lower band gap material within a vicinity of the higher band gap material. As an example, the lower band gap material includes both the high indium or thick InGaN regions and the quantum well regions. In a specific embodiment, the higher bandgap material is comprised of GaN, AlGaN, or InAlGaN. In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au) or nickel and gold (Ni/Au), but can be others.

In a specific embodiment, the laser device has active region 207. The active region can include one to twenty quantum well regions according to one or more embodiments. As an example following deposition of the n-type AluInvGa1-u-vN layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise AlwInxGa1-w-xN and AlyInzGa1-y-zN, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or AlwInxGa1-w-xN layer about 10 nm to 100 nm thick surrounded by GaN or AlyInzGa1-y-zN layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise AlsIntGa1-s-tN, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN superlattice structure, comprising alternating layers of AlGaN and GaN, each with a thickness between about 0.2 nm and about 5 nm. In another embodiment the electron blocking layer comprises InAlGaN. In yet another embodiment there is not electron blocking layer.

As noted, the p-type gallium nitride structure, is deposited above the electron blocking layer and active layer(s). The p-type layer may be doped with Mg, to a level between about 10E16 cm-3 and 10E22 cm-3, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In a specific embodiment, the invention provides an alternative device structure capable of emitting light in a ridge laser embodiment. The device is provided with one or more of the following epitaxially grown elements, but is not limiting, and in reference to FIG. 2B.

an n-GaN cladding region with a thickness of 50 nm to about 6000 nm with a Si or oxygen doping level of about 5E16 cm-3 to 1E19 cm-3 an InGaN region of a high indium content and/or thick InGaN layer(s) or Super SCH region;

a higher bandgap region overlying the InGaN region;

an InGaN region of a high indium content and/or thick InGaN layer(s) or Super SCH region;

a higher bandgap region overlying the InGaN region;

optionally, an SCH region overlying the InGaN region;

a strain control region overlying the higher bandgap region;

multiple quantum well active region layers comprised of four to six 3.0-5.5.0 nm InGaN quantum wells separated by 1.5-10.0 nm GaN or InGaN barriers optionally, a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 300 nm to 1000 nm with Mg doping level of 5E17 cm-3 to 3E19 cm-3 a p++-GaN contact layer with a thickness from 20 nm to 40 nm with Mg doping level of 5E19 cm-3 to 1E21 cm-3

In a specific embodiment, the laser device is fabricated on a {20-21} substrate.

FIG. 2B is a cross-sectional view of a laser device 200 fabricated on a {20-21} substrate according to an embodiment of the invention. As shown, the laser device includes gallium nitride substrate 203, which has an underlying n-type metal back contact region 201. An n-type cladding layer is formed overlying the gallium nitride substrate. Overlying the gallium nitride substrate and the n-type cladding layer is a high indium content and/or thick InGaN layer 202. In a specific embodiment, the device has a strain control layer 204 overlying the high indium content and/or thick InGaN layer. As shown, multiple strain control layers can be integrated with multiple high indium content and/or thick InGaN layers. In a specific embodiment, the metal back contact region is made of a suitable material such as those noted below.

In a specific embodiment, the device also has an overlying n-type gallium nitride layer 205, an n-type cladding layer, a high indium content and/or thick InGaN layer 202, a stain control layer 204, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about 10E16 cm-3 and 10E20 cm-3.

An n-type $Al_uIn_vGa_{1-u-v}N$ layer, where $0 \le u, v, u+v \le 1$, is deposited on the substrate. In a specific embodiment, the carrier concentration may lie in the range between about 10E16 cm-3 and 10E20 cm-3. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 15000. A flow of disilane in a carrier gas, with a total flow rate of between about 0.1 and 10 sccm, is initiated.

The high indium content and/or thick InGaN layer(s) or regions comprises an InGaN or like material capable of manipulating an optical mode or modes within a design of a laser diode. As an example, such InGaN region or layers are characterized by a thickness range and an indium concentration range that leads to excessive cumulative strain within the growth structures and hence certain material degradation in the growth structures without the presence of strain control region(s) or layer(s). That is, if there were no strain control region, such InGaN layers would be detrimentally strained and lead to poor or undesirable material characteristics such as photoluminescence, electroluminescence, and optical device efficiency due to certain defect characteristics within the structure that could be located in the quantum well region, and/or at the interface between the high indium content and/or thick InGaN layer and the underlying layer, and/or in other regions. It should be noted that the InGaN layer(s) in its final form may be partially relaxed due to the presence of defects and/or the strain control region, although it would be strained without such defects and/or stain control region. As an example, such cumulative strain often is a function of a combination of indium concentration and total thickness. For lower indium content layers, much thicker layers are grown before cumulative strain degradation occurs, while higher indium content may result in thinner layers before cumulative strain degradation occurs. Also, a higher number of quantum wells may lead to higher cumulative stain than fewer quantum wells.

The present InGaN region can be configured with a suitable thickness and indium content for a laser diode device. Such InGaN region includes a thickness range from about 30 to about 80 nm and about 11 to about 16% indium content. Alternatively, the InGaN region includes a thickness range from about 70 to about 150 nm and about 8 to about 12% indium content. Alternatively, the InGaN region includes a thickness ranging from about 140 to about 300 nm and about 5 to about 9% indium content. Alternatively, the InGaN region includes a thickness ranging from about 250 to about 500 nm and about 3 to about 6% indium content. Alternatively, the InGaN region includes a thickness ranging from about 10 to about 30 nm and about 16 to about 21% indium content.

The strain control layer(s) or regions, which also serves as a compensation region, comprises a higher band gap material, which has a band gap higher than a lower band gap material within a vicinity of the higher band gap material. As an example, the lower band gap material includes both the high indium or thick InGaN regions and the quantum well regions. In a specific embodiment, the higher bandgap material is comprised of GaN, AlGaN, or InAlGaN. In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au) or nickel and gold (Ni/Au).

The laser device has active region 207. The active region can include one to twenty quantum well regions according to one or more embodiments. As an example following deposition of the n-type AluInvGa1-u-vN layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise AlwInxGa1-w-xN and AlyInzGa1-y-zN, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or AlwInxGa1-w-xN layer about 10 nm to 100 nm thick surrounded by GaN or AlyInzGa1-y-zN layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise AlsIntGa1-s-tN, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. In another embodiment the electron blocking layer comprises InAlGaN. In yet another embodiment there is not electron blocking layer.

As noted, the p-type gallium nitride structure, is deposited above the electron blocking layer and active layer(s). The p-type layer may be doped with Mg, to a level between about 10E16 cm-3 and 10E22 cm-3, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry. The device also has an overlying dielectric region, which exposes 213 contact region. In a specific embodiment, the dielectric region is an oxide such as silicon dioxide.

The metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

FIG. 3 is a simplified example of a simulation of the refractive index and mode profile for a green laser diode structure without a high indium content and/or thick InGaN (Super SCH) region or strain control region according to an embodiment of the invention. As shown, a vertical axis illustrates a refractive index plotted against a waveguide position for a baseline laser diode device, which will be explained in more detail below. The device has a gallium and nitrogen containing substrate comprising a surface region in a specific embodiment. The substrate is preferably GaN or other suitable material. In a specific embodiment, the surface region includes an n-type cladding region such as GaN or others. As also shown, the device includes an n-type SCH region, which is overlying the GaN. The n-type SCH region comprises InGaN. Overlying the cladding region are a plurality of quantum well regions having an InGaN/GaN alternating structure. The device also has an upper guide or SCH, which can be either GaN or InGaN. The device also has an electron blocking region, such as those made by AlGaN, AlInN, AlInGaN or other suitable materials. In a specific embodiment, the device has an overlying p-type cladding region, such as GaN, which is doped.

FIG. 4 is an example of growth characteristics of the laser diode of FIG. 3 according to an embodiment of the invention. As shown, the growth characteristics include a 0.9 Volt peak at about 515.5 nanometers. As also shown, the microfluorescence image at 500× is generally moderate to good, although it shows certain vertical lines related to defects, which are generally undesirable. As also shown are electroluminescence data, which are good, and photoluminescence data, which are good according to a specific embodiment.

FIG. 5 is an illustration of micro-fluorescence defect density for multiple laser diode structures according to an embodiment of the invention. As shown are (1) a base laser diode structure; (2) base laser diode structure with high indium content and/or thick InGaN regions below the MQW; and (3) base laser diode structure with high indium content and/or thick inGaN regions below the MQW and a strain control region. As an example, the base line diode structure may be illustrated by way of FIG. 3. As shown, the strain control region provides for lower defect density and facilitates integration and use of the high indium content and/or thick inGaN regions below the MQW. The high indium content and/or thick InGaN regions lead to improved laser diode characteristics based upon optical confinement or other purposes, while the strain control region causes improved characteristics from the MQW. Such improved characteristics include lower defect density according to a preferred embodiment.

FIG. 6 is a flow diagram of a method of tuning an active region for a desired strain characteristic according to an embodiment of the invention. In a specific embodiment, the present method may be outlined as follows:
1. Provide a gallium and nitrogen containing substrate into a reaction chamber for growth;
2. Deposit an n-type cladding regions overlying the substrate using a growth method;
3. Deposit a high indium content or thick InGaN or low Al content InAlGaN regions in desirable compositions and doping for desirable waveguiding and electrical characteristics;
4. Deposit higher bandgap strain control regions with desired thickness and doping levels overlying the high indium content InGaN or InAlGaN regions;
5. Deposit MQW active regions overlying the strain control regions;
6. Optionally, deposit SCH regions overlying the MQW regions;
7. Optionally, deposit electron blocking regions overlying the SCH regions or MQW;
8. Deposit p-type cladding regions overlying the electron blocking regions;
9. Deposit p-type contact regions overlying the p-type cladding regions;
10. Remove completed substrate from chamber;
11. Perform remaining processes to form laser diode devices; and
12. Perform other steps, as desired.

FIG. 7 is an illustration of a method of providing waveguide characteristics for laser diode devices according to embodiments of the invention. As shown, the graphical illustration shows optical confinement for within p-type regions such as the p-cladding in a positive direction and negative direction. The illustration also shows an intersecting axis of optical confinement for MQW in a positive direction and a negative direction. A baseline starting point is provided at the intersection or origin, which represents the confinement characteristics for a baseline laser design without inclusion of the high indium content and/or thick InGaN (Super SCH) region or strain control region. Also shown are a most preferred modification and a least preferred modification. In a preferred embodiment, optical confinement is in the negative p-type region direction and in the positive MQW direction relative to the baseline design at the origin. Other quadrants include those for improvements such as reduced optical confinement in the p-type regions and reduced confinement in the MQW region or increased optical confinement in the MQW and increased optical confinement in the p-type regions, although not most preferable. In a preferred embodiment, the active region is configured with a strain control region to facilitate integration of a high indium content region or thick indium content region, which achieves desirable confinement characteristics of the optical mode.

FIG. 8 is an illustration of photoluminescence peak intensity for multiple laser diode structures according to an embodiment of the invention. As shown are (1) a base laser diode structure; (2) base laser diode structure with high indium content and/or thick InGaN regions below the MQW; and (3) base laser diode structure with high indium content and/or thick inGaN regions below the MQW and a strain control region. As an example, the base line diode structure may be illustrated by way of FIG. 3. As shown, the strain control region provides for higher photoluminescence while achieving high indium content and/or thick inGaN regions below the MQW, which are generally desirable. That is, the strain control regions below the MQW and above the high indium content and/or thick InGaN layer causes improved characteristics from the MQW. Such characteristics include higher photoluminescence according to a preferred embodiment.

FIG. 9 is an illustration of electroluminescence power for multiple laser diode structures according to an embodiment of the invention. As shown are (1) a base laser diode structure; (2) base laser diode structure with high indium content and/or thick InGaN regions below the MQW; and (3) base laser diode structure with high indium content and/or thick inGaN regions below the MQW and a strain control region. As an example, the base line diode structure may be illustrated by way of FIG. 3. As shown, the strain control region provides for higher electroluminescence power while achieving high indium content and/or thick inGaN regions below the MQW, which are generally desirable. That is, the strain control region below the MQW causes improved characteristics from the MQW. Such characteristics include higher electroluminescence according to a preferred embodiment.

FIG. 10 is an example of a simulation of the refractive index and mode profile for a green laser diode structure according to an embodiment of the invention with the inclusion of the high indium content and/or thick InGaN (Super SCH) region and the strain control region. As shown, a vertical axis illustrates a refractive index plotted against a waveguide position for an improved laser diode device, which will be explained in more detail below. The device has a gallium and nitrogen containing substrate comprising a surface region in a specific embodiment. The substrate is preferably GaN or other suitable material. In a specific embodiment, the surface region includes an InGaN region, which may or may not be partially relaxed. Overlying the InGaN region is a strain control region. In a specific embodiment, the strain control region is made of GaN. Also, the strain control region is a higher bandgap material such as GaN or AlGaN. As also shown, the device includes an n-type SCH region, which is overlying the GaN. In a specific embodiment, the n-type SCH region comprises InGaN. Overlying the SCH are a plurality of quantum well regions having an InGaN/GaN alternating structure. In a specific embodiment, the device also has an upper guide or SCH, which can be either GaN or InGaN. The device also has an electron blocking region, such as those made by AlGaN, AlInGaN or other suitable materials such as AlInN. In a specific embodiment, the device has an overlying p-type cladding region, such as GaN, which is doped. Further details of growth characteristic can be found throughout the present specification and more particularly below. Further details of the present active region can be found below.

The present device provides for selected optical characteristics. That is, the device is characterized by a 51% reduction in optical mode confinement within the pGaN region for reduced loss, which is preferable. Additionally, the device is characterized by a 13% reduction in an optical mode confinement within the multi-quantum well regions, which will reduce the modal gain, which is not preferable.

The device is provided with one or more of the following epitaxially grown elements, but is not limiting.

an n-cladding layer(s);

an InGaN region comprised of an indium content of 10% by weight and a thickness of about 100 nanometers, but can range from about 60 nm to about 150 nm and indium content from about 8% to about 15% and could be others.

a higher bandgap region overlying the InGaN region, the higher bandgap region configured as a strain control region;

an SCH region overlying the higher bandgap region;

multiple quantum well active region layers comprised of five 3.0-5.5.0 nm InGaN quantum wells separated by six 1.5-10.0 nm GaN barriers;

a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 400 nm to 1000 nm with Mg doping level of 5E17 cm-3 to 3E19 cm-3 a p++-GaN contact layer with a thickness from 20 nm to 40 nm with Mg doping level of 5E19 cm-3 to 1E21 cm-3

In a specific embodiment, the laser device is fabricated on a {20-21} substrate.

FIG. 11 is an example of growth characteristics for the laser diode of FIG. 10 according to an embodiment of the invention. As shown, the growth characteristics include a 0.82 Volt peak at about 519.6 nanometers. As also shown, the defect structure observed in the micro-fluorescence image at 500× is generally good to moderate, which has been achieved using a combination of a thick InGaN region of about 100 nm at about 10% indium content and a higher bandgap material for a strain control region.

FIG. 12 is a transmission electron microscope image for the laser diode of FIG. 10 according to an embodiment of the invention. As shown, the images show no observable defects within the SCH or MQW region, which is desirable. Certain defects, however, can be seen between the n type GaN and thick InGaN material. These defects are believed to be misfit dislocations. It is believed that such defects lead to a reduction in strain within the thick InGaN material causing it to be in a partially relaxed state.

FIG. 13 illustrates microfluorescence of laser devices without strain control regions according to embodiments of the invention. The laser device is similar to the one in FIG. 10 without the strain control regions or higher bandgap regions. As shown are micro-fluorescence images of (1) a laser diode device with a higher bandgap region overlying a partially relaxed inGaN material; and (2) a laser diode device without the higher bandgap region, which is highly defected.

FIG. 14 is an example of growth characteristics for a laser diode of FIG. 13 according to an embodiment of the invention. As shown, the growth characteristics include a 0.3 Volt peak at about 512.4 nanometers, which is a lower peak voltage than preferred embodiments. As also shown, the micro-fluorescence image at 500× is generally poor as it shows a very high defect density, which has been caused using a thick InGaN region of about 100 nmat about 10% indium content and without the higher bandgap material or strain control region.

FIGS. 15A and 15B are transmission electron microscope images of cross-sections of laser diodes without strain control regions according to embodiments of the invention. As shown, a substantial defect density can be seen between the n type GaN substrate and thick InGaN material, which indicates that the InGaN layer is substantially more relaxed that the structure in FIG. 12 that includes the strain control region. The images also show observable defects within the MQW region, which are undesirable.

FIG. 16 is an example of a simulation of the refractive index and mode profile for a green laser diode structure according to an alternative embodiment of the invention with the inclusion of the high indium content and/or thick InGaN (Super SCH) region and the strain control region. As shown, a vertical axis illustrates a refractive index plotted against a waveguide position for an improved laser diode device, which will be explained in more detail below. The device has a gallium and nitrogen containing substrate comprising a surface region in a specific embodiment. The substrate is preferably GaN or other suitable material. In a specific embodiment, the surface region includes an InGaN region, which may or may not be partially relaxed. Overlying the InGaN region is a strain control region. In a specific embodiment, the strain control region is made of GaN. Also, the strain control region is a higher bandgap material such as GaN. As also shown, the device includes an n-type SCH region, which is overlying the GaN. In a specific embodiment, the n-type SCH region comprises InGaN. Overlying the SCH are a plurality of quantum well regions having an InGaN/GaN alternating structure. In a specific embodiment, the device also has an upper guide or SCH, which can be either GaN or InGaN. The device also has an electron blocking region, such as those made by AlGaB, AlInN, AlInGaN or other suitable materials. In a specific embodiment, the device has an overlying p-type cladding region, such as GaN, which is doped.

The present device provides for selected optical characteristics. That is, the device is characterized by a 54% reduction in optical mode confinement within the pGaN region, which is preferable to reduce modal losses in the laser diode. Additionally, the device is characterized by a 23% reduction in an optical mode confinement within the multi-quantum well regions, which is not preferable as it will reduce the modal gain of the laser diode.

The device is provided with one or more of the following epitaxially grown elements, but is not limiting.

an n-cladding region;

an InGaN region comprised of an indium content of 6% by atomic percent and a thickness of about 200 nanometers, but can range from about 150 nm to about 350 nm and indium content from about 4% to about 8% and could be others.

a higher bandgap region overlying the InGaN region, the higher bandgap region configured as a strain control region and has a thickness of about 10-50 nanometers;

an SCH region overlying the higher bandgap region;

multiple quantum well active region layers comprised of five 3.0-5.5.0 nm InGaN quantum wells separated by six 1.5-10.0 nm GaN barriers;

a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 400 nm to 1000 nm with Mg doping level of 5E17 cm-3 to 3E19 cm-3 a p++-GaN contact layer with a thickness from 20 nm to 40 nm with Mg doping level of 5E19 cm-3 to 1E21 cm-3

The laser device is fabricated on a {20-21} substrate.

FIG. 17 is an example of growth characteristics for the laser diode of FIG. 16 according to an alternative embodiment of the invention. As shown, the growth characteristics include a 1.1 Volt peak at about 514.5 nanometers. As also shown, the micro-fluorescence image at 500× is generally good, which has been achieved using a combination of a thick InGaN region of about 200 nmat about 6% indium content and a higher bandgap material or strain control region ranging in thickness from about 10 to 50 nanometers.

FIG. 18 is an example of a simulation of the refractive index and optical mode profile of a green laser diode structure according to an alternative embodiment of the invention with the inclusion of the high indium content and/or thick InGaN (Super SCH) region and the strain control region. As shown, a vertical axis illustrates a refractive index plotted against a waveguide position for an improved laser diode device, which will be explained in more detail below. The device has a gallium and nitrogen containing substrate comprising a surface region in a specific embodiment. The substrate is preferably GaN or other suitable material. In a specific embodiment, the surface region includes anInGaN region, which may or may not be partially relaxed. Overlying the InGaN region is a strain control region. In a specific embodiment, the strain control region is made of GaN. Also, the strain control region is a higher bandgap material such as GaN or AlGaN. Overlying the strain control region are a plurality of quantum well regions having an InGaN/GaN alternating structure. In a specific embodiment, the device also has an upper guide or SCH, which can be either GaN or InGaN. The device also has an electron blocking region, such as those made by AlGaN, AlInGaN, or AlInN or other suitable materials. In a specific embodiment, the device has an overlying p-type cladding region, such as GaN, which is doped.

The present device provides for selected optical characteristics. That is, the device is characterized by a 3% increase in an optical mode confinement within the multi-quantum well regions, which is preferable as it will increase the modal gain. Additionally, the device is characterized by a 37% reduction in optical mode confinement within the pGaN region, which is preferable as it will reduce the modal loss.

The device is provided with one or more of the following epitaxially grown elements, but is not limiting.

an n-cladding layer(s);

an InGaN region comprised of an indium content of 6% by atomic percent and a thickness of about 200 nanometers, but can range from about 150 nm to about 350 nm in thickness and about 4% to about 8% indium content.

a higher bandgap region overlying the InGaN region, the higher bandgap region configured as a strain control region and has a thickness of about 10-50 nanometers;

multiple quantum well active region layers comprised of five 3.0-5.5.0 nm InGaN quantum wells separated by six 1.5-10.0 nm GaN barriers;

a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 400 nm to 1000 nm with Mg doping level of 5E17 cm-3 to 3E19 cm-3 a p++-GaN contact layer with a thickness from 20 nm to 40 nm with Mg doping level of 5E19 cm-3 to 1E21 cm-3

In a specific embodiment, the laser device is fabricated on a {20-21} substrate.

FIG. 19 is an example of growth characteristics for the laser diode of FIG. 18 according to an alternative embodiment of the invention. As shown, the growth characteristics include a 0.83 Volt peak at about 512.4 nanometers. As also shown, the micro-fluorescence image at 500× is generally good with substantially few defects, which has been achieved using a combination of a thick InGaN region of about 200 nmat about 6% indium content and a higher bandgap material or strain control region ranging in thickness from about 10 to 50 nanometers.

FIG. 20 is an example of a simulation of the refractive index and optical mode profile of a green laser diode structure according to an alternative embodiment of the invention with the inclusion of the high indium content and/or thick InGaN (Super SCH) region and the strain control region. As shown, a vertical axis illustrates a refractive index plotted against a waveguide position for an improved laser diode device, which will be explained in more detail below. The device has a gallium and nitrogen containing substrate comprising a surface region in a specific embodiment. The substrate is preferably GaN or other suitable material. In a specific embodiment, the surface region includes anInGaN region which may or may not be partially relaxed. Overlying the InGaN region is a strain control region. In a specific embodiment, the strain control region is made of GaN. Also, the strain control region is a higher bandgap material such as GaN or AlGaN. Overlying the strain control region are a plurality of quantum well regions having an InGaN/GaN alternating structure. In a specific embodiment, the device also has an upper guide or SCH, which can be either GaN or InGaN. The device also has an electron blocking region, such as those made by AlGaN, AlInGaN, AlInN or other suitable materials. In a specific embodiment, the device has an overlying p-type cladding region, such as GaN, which is doped.

The device provides for a 12% increase in an optical mode confinement within the multi-quantum well regions, which is preferable as it will increase the modal gain of the laser diode. Additionally, the device is characterized by a 35% reduction in optical mode confinement within the pGaN region, which is preferable as it will reduce the modal loss of the laser diode.

The device is provided with one or more of the following epitaxially grown elements, but is not limiting.

an n-cladding layer(s);

an InGaN region comprised of an indium content of 15% by atomic percent and a thickness of about 60 nanometers, but can range from about 30 nm to about 80 nm in thickness and about 10% to about 17% indium content.

a higher bandgap region overlying the InGaN region, the higher bandgap region configured as a strain control region and has a thickness of about 10-50 nanometers;

multiple quantum well active region layers comprised of five 3.0-5.5.0 nm InGaN quantum wells separated by six 1.5-10.0 nm GaN barriers;

a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 10 nm to 15 nm and doped with Mg.

a p-GaN cladding layer with a thickness from 300 nm to 1000 nm with Mg doping level of 5E17 cm-3 to 3E19 cm-3 a p++-GaN contact layer with a thickness from 20 nm to 40 nm with Mg doping level of 5E19 cm-3 to 1E21 cm-3

In a specific embodiment, the laser device is fabricated on a {20-21} substrate.

FIG. 21 is an example of growth characteristics for the laser diode of FIG. 18 according to an alternative embodiment of the invention. As shown, the growth characteristics include a 0.4 Volt peak at about 519.6 nanometers. As also shown, the micro-fluorescence image at 500× is generally good, which has been achieved using a combination of a thick InGaN region of about 60 nm at about 15% indium content and a higher bandgap material or strain control region ranging in thickness from about 10 to 50 nanometers.

FIG. 22A is an example of a simulation of the refractive index and optical mode profile of a green laser diode structure with high indium content InGaN region above and below the MQW of a laser diode according to an alternative embodiment of the invention with the inclusion of the high indium content and/or thick InGaN (Super SCH) region(s) and the strain control region(s). As shown, the MQW is configured between a pair of the strain control regions and respective pair of Super SCH regions or high indium content and/or thick InGaN regions. In this example, the high indium content and/or thick InGaN layer is about 60 nm and has a 12% indium content, although there can be variations. The present device provides a 23% increase in an optical mode confinement within the multi-quantum well regions. Additionally, the device is characterized by a 54% reduction in optical mode confinement within the pGaN region. The higher bandgap strain control layer is about 10 to 50 nm thick, and is composed of GaN. In other examples, each of the high indium content and/or thick InGaN layers may be configured differently with substantial or slight variations.

FIG. 22B is an example of a simulation of the refractive index and optical mode profile of a green laser diode structure with a daisy chain of high indium content and strain control regions configured to tune a lattice constant within an active region of a laser diode according to an alternative embodiment of the invention. As shown, the device includes a plurality of high indium content and/or thick InGaN layers integrated with a plurality of high bandgap strain control regions according to this example. As shown, the device includes a first, a second, and a third high indium content and/or thick InGaN layer. A first strain control region is provided spatially between the first and second indium content layers. A second stain control region is provided spatially between the second and third indium content layers. A third strain control region is provided spatially between the third indium content layer and multiquantum well region, as shown. In other embodiments, the optical device can include N indium content layers, where N is an integer greater than three (3) and also include M strain control regions, where M is an integer greater than three (3), although M and N may not be equal in some cases.

In this example, the high indium content and/or thick InGaN layer is about 100 nm and has a 10% indium content, although there can be variations. The higher bandgap strain control layer is about 8 to 50 nm thick, and is composed of GaN, but could be others. In other examples, each of the high indium content and/or thick InGaN layers may be configured differently with substantial or slight variations.

The method forms via growth multiple high indium content and/or thick InGaN layers followed by stain control regions. It is believed a lattice constant can be altered continuously and integrally from the first stain control region to the second strain control region. As an example, the lattice constant in strain control regions near the multi-quantum well are configured and will be larger (similar to InGaN with a higher indium composition), which should enable growth of higher indium content multiquantum wells. Such higher indium content multiquantum wells can lead to emission of electromagnetic radiation in wavelength ranges in yellow and even red regimes or could lead to improved efficiency in the red, green, or yellow regimes. In such embodiments, cladding regions and associated barriers are comprised of InGaN (since GaN would be strained to the new lattice constant, and would not form effectively).

FIG. 22C is an example of a simulation of the refractive index and optical mode profile of a green laser diode structure with an intermediate strain control region within a high indium content and/or thick InGaN regions of a laser diode according to an alternative embodiment of the invention. As shown, the device includes a plurality of high indium content and/or thick InGaN layers integrated with a plurality of high bandgap strain control regions according to this example. As shown, the device includes a first and a second high indium content and/or thick InGaN layer. A first strain control region is provided spatially between the first and second indium content layers. A second strain control region is provided spatially between the second indium content layer and multiquantum well region, as shown. That is, other embodiments can include any combination of intermediary strain control layers, including multiple strain control layers integrally disposed with high indium content and/or thick InGaN layers.

In this example, the high indium content and/or thick InGaN layer is about 30 nm and has a 15% indium content, although there can be variations. The higher bandgap strain control layer is about 3 to 30 nm thick for the intermediate layer and about 10 to 50 nm for the uppermost strain control layer, and is composed of GaN. In this example the n-SCH is removed from between the high indium content and/or thick InGaN layer and the higher bandgap layer. The present device provides a 8% increase in an optical mode confinement within the multi-quantum well regions. Additionally, the device is characterized by a 35% reduction in optical mode confinement within the pGaN region. In other examples, each of the high indium content and/or thick InGaN layers may be configured differently with substantial or slight variations.

FIG. 22D is an example of the refractive index and optical mode profile of a green laser diode structure employing multiple intermediate strain control regions within a high indium content and/or thick InGaN regions according to an alternative embodiment of the invention. As shown, the device includes a plurality of high indium content and/or thick InGaN layers integrated with a plurality of high bandgap strain control regions.

In this example, the high indium content and/or thick InGaN layer is about 30 nm and has a 15% indium content, although there can be variations. The higher bandgap strain control layer is about 3 to 30 nm thick for the intermediate layer and about 10 to 50 nm for the uppermost strain control layer, and is composed of GaN. The present device provides a 10% increase in an optical mode confinement within the multi-quantum well regions. Additionally, the device is characterized by a 35% reduction in optical mode confinement within the pGaN region. In this example the n-SCH is removed from between the high indium content and/or thick InGaN layer and the higher bandgap layer. In other examples, each of the high indium content and/or thick InGaN layers may be configured differently with substantial or slight variations.

The present method and structure provide for a selective configuration of multiple strain control regions coupled to multiple high indium and/or thick InGaN regions. Each of the regions can be selectively tuned to increase a lattice constant from a GaN substrate region to a quantum well region. By way of increasing the lattice constant, indium is preferably added into a gallium and nitrogen containing material in the multi-quantum well region, which now has less strain leading to fewer defects and degradation.

The invention provides an optical device having multiple high indium and/or thick InGaN regions. As an example, such device includes a gallium and nitrogen containing substrate comprising a surface region oriented in either a semipolar or non-polar configuration. The device also has a first gallium and nitrogen containing material comprising InGaN overlying the surface region. The device has a first strain control region overlying the first gallium and nitrogen containing material and a second gallium and nitrogen containing material comprising InGaN overlying the surface region. The device also has a second strain control region overlying the first gallium and nitrogen containing material and a plurality of quantum well regions overlying the strain control region. In a specific embodiment, the device further comprising an nth strain control region, where n is an integer greater than two (2), three, four, five, six, and others. Each of the strain control regions is configured with at least one high indium indium and/or thick InGaN region or a pair of such regions. Each of the strain control regions has a lattice constant which is larger from the GaN substrate toward the multi-quantum well region. The lattice constants increase from a first lattice constant, second lattice constant . . . to an nth lattice constant, which helps facilitates the formation of a multiquantum well region for longer wavelength emissions, e.g., red, yellow. FIG. 23 is a simplified example of a simulation of the refractive index and optical mode profile of a green laser diode structure with a high indium content InGaN layer that causes the total structure to exceed a total strain budget according to an embodiment of the invention. In another example, the present device exceeds a stain budget, which leads to undesirable characteristics. The device includes a similar structure, however, the indium content of the 100 nm partially relaxed InGaN region is 15% and greater. The present device provides a 32% reduction in an optical mode confinement within the multi-quantum well regions. Additionally, the device is characterized by a 72% reduction in optical mode confinement within the pGaN region.

FIG. 24 is an example of growth characteristics for a laser diode of FIG. 23 according to the alternative embodiment of the invention. As shown, the growth characteristics include a 0.56 Volt peak at about 518.6 nanometers. As also shown, the micro-fluorescence image at 500× is generally different or hatched, which has been caused using a combination of a thick InGaN region having a high indium content, which is beyond some threshold, and a higher bandgap material or strain control region ranging in thickness from about 10 to 50 nanometers.

FIG. 25 includes transmission electron microscope images of the laser diode of FIG. 23 according to the alternative embodiment of the invention. As shown, the images show observable defects within the MQW and SCH regions, which are undesirable. Substantial defects can be seen between the n type GaN layer and thick InGaN material.

Figure 26:
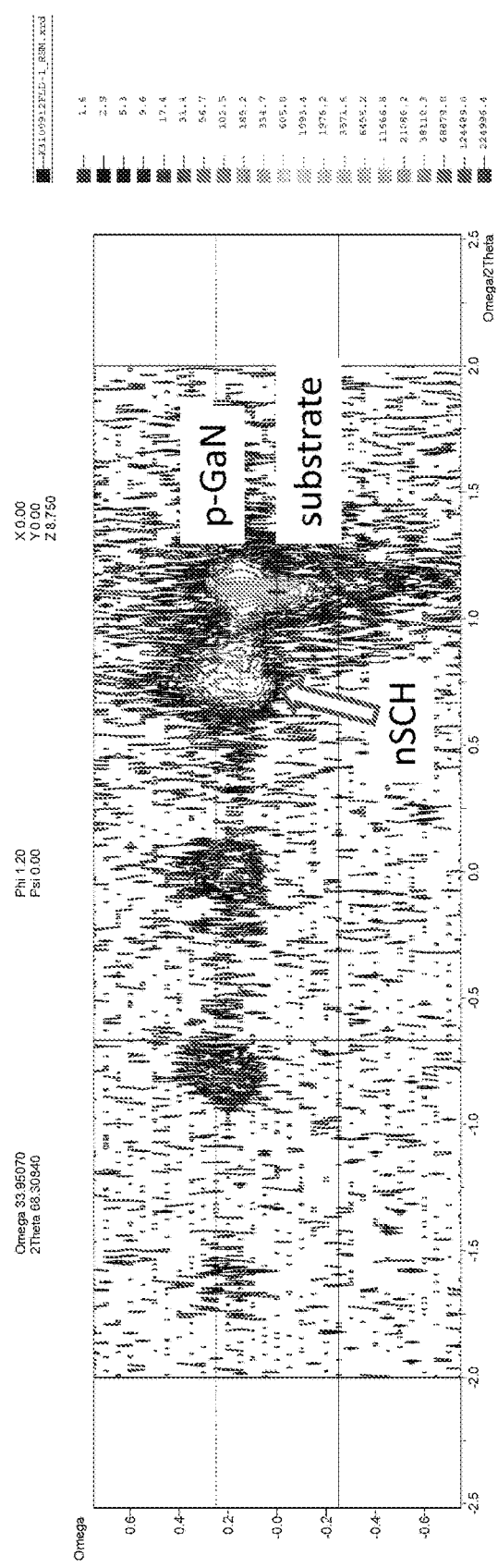
FIGS. 26 and 27 are illustrations of RSM plots.
Figure 27:
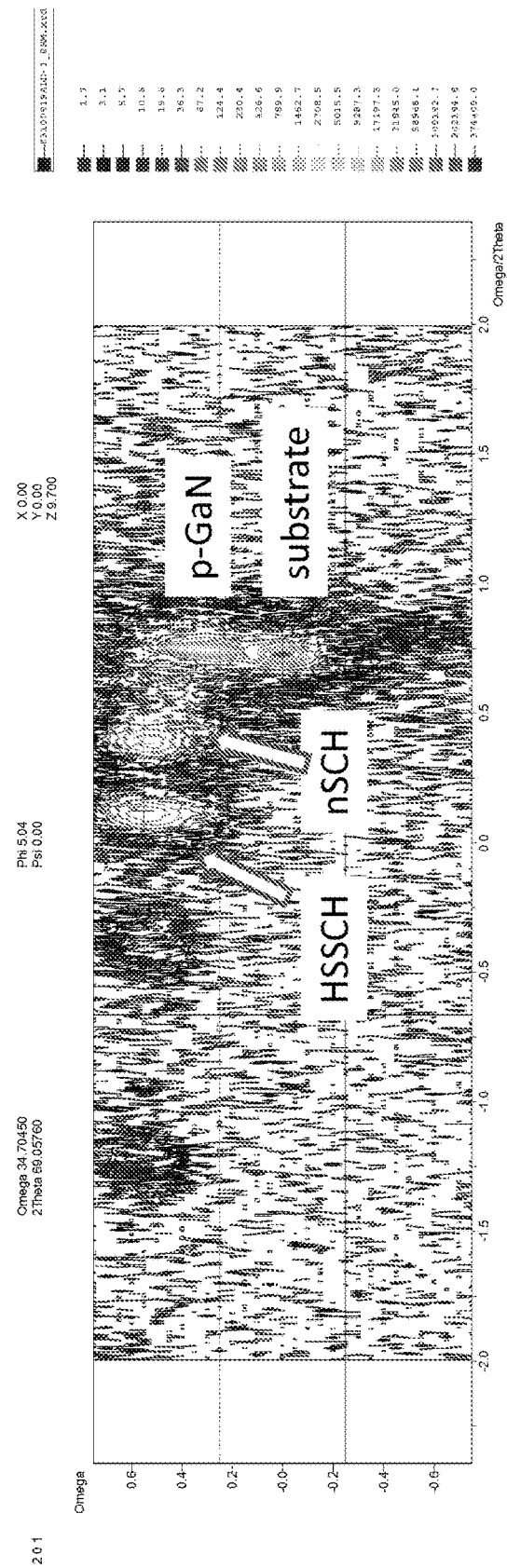

FIGS. 26 and 27 are illustrations of reciprocal space map (RSM) plots of laser diode devices according to embodiments of the invention. The GaN substrate is characterized by a tilt angle of zero and is configured on a semi-polar plane such as {20-21}, but can have variations, modifications, and alternatives. In the present example, the substrate includes growth structures similar to those described in the present specification. FIG. 26 is for a laser diode device including a growth structure free from HS-SCH. In this example, the tilt angle of the nSCH to the substrate is 0.15 degrees; the average misfit dislocation spacing is ~103 nm; the MQW $0^{th}$ order and nSCH peaks overlap (this nSCH/MQW peak is not in a straight line with the substrate, so the nSCH/MQW is not lattice matched with the substrate); the pGaN is likely partially-relaxed (tensile strain); and it is estimated that there are misfit dislocations at the nSCH/nGaN and in the vicinity of the pGaN/EBL interface. FIG. 27 is for a laser diode device including a growth structure having HS-SCH, which shows that the lattice constant of overlying regions are substantially equal and different from the GaN substrate. In this example, the tilt angle of the nSCH to the substrate is 0.526 degrees; the tilt angle of the HS-SCH to the substrate is 0.530 degrees (about the same as the nSCH); the average misfit dislocation spacing is ~29 nm; the MQW $0^{th}$ order and nSCH peaks overlap; the HS-SCH, nSCH, and pGaN are not coherent with respect to the substrate; the tilt angles of the HS-SCH, nSCH peak are significantly larger than the regular LD (most likely the nSCH is pseudomorphic with respect to the partially-relaxed HS-SCH); and the pGaN is likely partially-relaxed (tensile strain). As shown FIGS. 26 and 27, a tilt angle of the SCH/MQW increases from 0.15 Degree to 0.53 Degree (causing a difference in tilt angles, e.g., greater than 2×, 3×, 4×) upon adding the HS-SCH, which corresponds to an average misfit dislocation spacing changing from 103 nm to 29 nm. In a specific embodiment, the in-plane lattice-constant parallel to c-projection <10$\bar{1}$6> for the HS-SCH is larger than that for the nSCH (in the FIG. 26 LD structure), which itself is larger than that for the underlying GaN substrate. Also, it is clear from the TEM and micro-fluorescence data that if the strain control layer is omitted, the misfit dislocation density is drastically higher and the material quality breaks down eliminating the material's suitability for growing high quality light emitting regions in this particular laser structure. It is believed, as supported by the RMS plots, that the present combination of strain control region and semi-polar oriented substrates leads to relaxation of overlying regions, which yield larger lattice constants, unlike the conventional devices. One or more of the features of the present method and structure are as follows:

1. In a specific embodiment, the present method and structure substantially changes the lattice constant, which was unexpected, of the light emitting region while maintaining good material quality in the light emitting region when the relaxation layer is introduced followed by the strain control layer. Note: Conventional epitaxial growth on conventional c-plane substrates does not cause a change in in-plane lattice constant (i.e., less than 0.1%) and therefore leads to large dislocations and/or breakage of subsequently grown epitaxial regions.

The present method and structure allows for introduction of higher indium content layers in our epitaxial structure to maintain high efficiency light emitting regions for additional design flexibility such as improved wave guiding in laser diodes.

The method and structure allows for the growth of a relaxation layer and then grow subsequent layers on top with a different lattice constant. The relaxation layer can be a gallium containing, nitrogen containing, and indium containing region, but may have variations. Depending upon the embodiment, different epitaxial structures can be provided overlying the relaxation layer(s).

Although the above has been described in terms of specific embodiments, there can be other variations, modifications, and alternatives. As an example, the embodiments above are described in terms of a certain pGaN confinement. However, the pGaN confinement may be generalized to confinement of p-type regions, which includes p-type cladding regions. In other examples, the p-type confinement includes pAlGaN. In other embodiments, the technique can be generalized to any p-type region above a MQW region and the like.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 and even non-standard packaging. The present device can be implemented in a co-packaging configuration such as those described in U.S. Provisional Application No. 61/347,800, commonly assigned, and hereby incorporated by reference for all purposes.

The present laser device can be provided in a laser display such as those described in U.S. Ser. No. 12/789,303 filed May 27, 2010, which claims priority to U.S. Provisional Nos. 61/182,105 filed May 29, 2009 and 61/182,106 filed May 29, 2009, each of which is hereby incorporated by reference herein.

While the above is a full description of the specific embodiments, various modifications, alternative constructions and equivalents may be used. As used herein, the term "substrate" can mean the bulk substrate or can include overlying growth structures such as a gallium and nitrogen containing epitaxial region, or functional regions such as n-type GaN, combinations, and the like. Therefore, the above description and illustrations should not be taken as limiting the scope of the invention which is defined by the appended claims.

What is claimed is:

1. A system comprising:
   a laser display; and
   a laser device configured to provide light for the laser display, the laser device comprising:
   a gallium and nitrogen containing substrate including a surface region and a first lattice constant;
   a single or plurality of strained regions acting as an optical confinement region overlying the surface region, the strained region having a second lattice constant, the second lattice constant being larger than the first lattice constant;
   a strain control region disposed between or above one or more of the strained regions having a third lattice constant, the third lattice constant being substantially equivalent to the second lattice constant, the strain control region being configured to maintain at least a quantum well region within a predetermined strain state;
   a plurality of quantum well regions overlying the optical confinement region, each of the plurality of quantum well regions having a fourth lattice constant, the fourth lattice constant being substantially equivalent to the second lattice constant, whereupon the strain control region has a higher bandgap than the strained region and the quantum well regions.

2. The system of claim 1 wherein:
   the strained region comprises an interface region between the substrate and the strain control region; and
   the interface region comprises a plurality of dislocations.

3. The system of claim 1 wherein the surface region is configured in a {20-21} semi-polar orientation and the device is a laser diode device, or the surface region is configured to be in an off-set of a {20-21} orientation and the strained region is at least partially relaxed.

4. The system of claim 1 further comprising:
   at least one barrier region sandwiched between a pair of quantum well regions;
   each of the barrier regions comprising GaN, InGaN, AlGaN, or AlInGaN; and
   each of the barrier regions ranges in thickness from 1.5 nm to 12 nm.

5. The system of claim 1 wherein:
   the strained region comprises a single layer of InGaN;
   the strained region has a thickness ranging from 20 to 80 nm with 2 to 20% InN content;
   the strained region is overlaid with a single strain control layer comprised of GaN or AlGaN; and
   the strain control layer has a thickness ranging from 2-20 nm with 2 to 40% AlN content.

6. The system of claim 1 wherein:
   the strained region comprises multiple layers of GaN, AlN, AlInN, AlGaInN, or InGaN;
   the multiple layers have a thickness ranging from 10 to 50 nm with 2 to 25% InN content;
   the multiple layers are separated by strain control layers comprises of AlGaN;
   the strain control layers have thickness ranging from 2-20 nm with 2 to 40% AlN content.

7. The system of claim 1 wherein:
   the strained region comprises multiple layers of InGaN;
   the InGaN layers have a thickness ranging from 10 to 50 nm with 2 to 25% InN content;
   the InGaN layers are separated by strain control layers comprised of GaN;
   there are a plurality of pairs of strained and strain control layers;
   the thickness of the strained layers is equal or decreases with each subsequently deposited layer;

the composition of strained layers is equal or increases in InN with each subsequently deposited layer.

\* \* \* \* \*